(12) United States Patent
Jacquet et al.

(10) Patent No.: US 12,191,865 B2
(45) Date of Patent: Jan. 7, 2025

(54) PHASE LOCK LOOP (PLL) SYNCHRONIZATION

(71) Applicants: Space Exploration Technologies Corp., Hawthorne, CA (US); Iliana Ghazali

(72) Inventors: David Francois Jacquet, Vaulnaveys le Haut (FR); Mostafa Ghazali, Grenoble (FR); Masoud Kahrizi, Irvine, CA (US); Andras Tantos, Bellevue, WA (US)

(73) Assignee: Space Exploration Technologies Corp., Hawthorne, CA (US)

( * ) Notice: Subject to any disclaimer, the term of this patent is extended or adjusted under 35 U.S.C. 154(b) by 0 days.

(21) Appl. No.: 18/225,477

(22) Filed: Jul. 24, 2023

(65) Prior Publication Data

US 2023/0378960 A1 Nov. 23, 2023

Related U.S. Application Data

(63) Continuation of application No. 17/714,081, filed on Apr. 5, 2022, now Pat. No. 11,711,084, which is a continuation of application No. 17/401,208, filed on Aug. 12, 2021, now Pat. No. 11,329,653, which is a continuation of application No. 16/858,675, filed on Apr. 26, 2020, now Pat. No. 11,133,806.

(60) Provisional application No. 62/982,998, filed on Feb. 28, 2020, provisional application No. 62/847,833, filed on May 14, 2019.

(51) Int. Cl.
*H03L 7/07* (2006.01)
*H03L 7/197* (2006.01)

(52) U.S. Cl.
CPC .............. *H03L 7/07* (2013.01); *H03L 7/1976* (2013.01)

(58) Field of Classification Search
CPC ................................ H03L 7/07; H03L 7/1976
See application file for complete search history.

(56) References Cited

U.S. PATENT DOCUMENTS

| | | |
|---|---|---|
| 5,844,436 A | 12/1998 | Altmann |
| 5,903,745 A | 5/1999 | Nakayama et al. |
| 6,058,486 A | 5/2000 | Nakayama |
| 7,005,907 B2 * | 2/2006 | Ibuka ........................ G06F 1/10 |
| | | 327/295 |
| 7,167,532 B1 | 1/2007 | Bronfer et al. |
| 7,483,173 B2 | 1/2009 | Sadowara |

(Continued)

FOREIGN PATENT DOCUMENTS

| | | | |
|---|---|---|---|
| CN | 103810319 A | | 5/2014 |
| CN | 112584402 A | * | 3/2021 |

(Continued)

OTHER PUBLICATIONS

International Search Report and Written Opinion dated Aug. 28, 2020, issued in corresponding International application No. PCT/US2020/032282, filed May 10, 2020, 12 pages.

*Primary Examiner* — Adam D Houston
(74) *Attorney, Agent, or Firm* — Polsinelli PC

(57) ABSTRACT

In an embodiment, an apparatus includes one or more timing components configured to generate a reference time signal based on a timing signal and a reference clock signal. The apparatus includes phase lock loop (PLL) configured to generate a synchronized output clock signal based on the reference clock signal and the reference time signal.

25 Claims, 12 Drawing Sheets

(56) References Cited

U.S. PATENT DOCUMENTS

| | | | |
|---|---|---|---|
| 8,508,879 B1* | 8/2013 | Zou | G11B 20/1024 360/51 |
| 9,285,826 B2* | 3/2016 | Kulick | H03L 7/08 |
| 9,479,185 B2* | 10/2016 | Cali | H03L 7/1806 |
| 9,793,951 B2* | 10/2017 | Henry | H04B 1/0475 |
| 9,973,940 B1* | 5/2018 | Rappaport | H04B 3/46 |
| 9,979,408 B2* | 5/2018 | Mayer | H03L 7/087 |
| 10,116,315 B1* | 10/2018 | Zhuang | H03B 1/02 |
| 10,153,728 B2* | 12/2018 | Cho | H01F 38/14 |
| 10,320,586 B2* | 6/2019 | Henry | H04L 12/6418 |
| 10,439,675 B2* | 10/2019 | Johnson | H04B 3/56 |
| 10,509,104 B1* | 12/2019 | Dato | G01S 13/87 |
| 10,879,998 B1* | 12/2020 | Deckman | H04W 56/0035 |
| 11,133,806 B1* | 9/2021 | Jacquet | H03L 7/1976 |
| 11,153,067 B2 | 10/2021 | Tantos et al. | |
| 2005/0289405 A1* | 12/2005 | Rivoir | G06F 1/12 714/700 |
| 2008/0204091 A1* | 8/2008 | Choo | G11C 29/02 327/149 |
| 2010/0277210 A1* | 11/2010 | Wang | H03L 7/099 327/147 |
| 2012/0039366 A1 | 2/2012 | Wood et al. | |
| 2012/0063553 A1* | 3/2012 | Carwana | H04B 7/0857 455/334 |
| 2012/0081608 A1* | 4/2012 | Carwana | H04N 21/4263 348/565 |
| 2013/0086410 A1* | 4/2013 | Kurd | G06F 1/08 327/157 |
| 2014/0132319 A1* | 5/2014 | Kushiyama | G11C 7/22 327/158 |
| 2014/0247076 A1 | 9/2014 | Cooke | |
| 2014/0321578 A1 | 10/2014 | Richards | |
| 2015/0084676 A1* | 3/2015 | McLaurin | H03L 7/23 327/142 |
| 2015/0263742 A1* | 9/2015 | McLaurin | H03L 7/1976 327/158 |
| 2016/0173111 A1* | 6/2016 | Cali | H03L 7/1976 327/156 |
| 2016/0277030 A1 | 9/2016 | Burbano et al. | |
| 2017/0237444 A1* | 8/2017 | Wei | H03L 7/0814 327/156 |
| 2017/0324419 A1* | 11/2017 | Mayer | H03L 7/0891 |
| 2018/0241122 A1* | 8/2018 | Jalali Mazlouman | H01Q 3/34 |
| 2019/0042505 A1* | 2/2019 | Subbareddy | G06F 13/4265 |
| 2019/0253125 A1* | 8/2019 | Apaydin | H01Q 21/22 |
| 2019/0302245 A1* | 10/2019 | Loinaz | G01S 7/4863 |
| 2019/0346877 A1* | 11/2019 | Allan | H03L 7/1976 |
| 2020/0005728 A1* | 1/2020 | Kurd | G09G 5/18 |
| 2020/0037381 A1* | 1/2020 | Ross | H04W 72/046 |
| 2020/0076439 A1* | 3/2020 | Weeks | H03L 7/0805 |
| 2020/0227130 A1* | 7/2020 | Kim | G11C 7/222 |
| 2020/0266804 A1* | 8/2020 | Kim | G06F 1/3296 |
| 2021/0025974 A1* | 1/2021 | Vacanti | H03L 7/0991 |

FOREIGN PATENT DOCUMENTS

| | | | |
|---|---|---|---|
| KR | 100532157 B1 | 11/2005 | |
| KR | 101275548 B1 | 6/2013 | |
| WO | WO-0201233 A2 * | 1/2002 | G01R 31/31937 |

* cited by examiner

PHASE LOCK LOOP (PLL) SYNCHRONIZATION

CROSS-REFERENCE TO RELATED APPLICATIONS

The present application is a continuation of U.S. patent application Ser. No. 17/714,081, filed Apr. 5, 2022, entitled "PHASE LOCK LOOP (PLL) SYNCHRONIZATION", which is a continuation of U.S. patent application Ser. No. 17/401,208, filed Aug. 12, 2021, now U.S. Pat. No. 11,329,653, entitled "PHASE LOCK LOOP (PLL) SYNCHRONIZATION", which is a continuation of U.S. patent application Ser. No. 16/858,675, filed Apr. 26, 2020, now U.S. Pat. No. 11,133,806, entitled "PHASE LOCK LOOP (PLL) SYNCHRONIZATION", which claims priority to U.S. Provisional Patent Application No. 62/982,998 filed Feb. 28, 2020 entitled "Phase Lock Loop (PLL) Synchronization" and U.S. Provisional Patent Application No. 62/847,833 filed May 14, 2019 entitled "Chip to Chip Time Synchronization," the disclosures all of which are hereby expressly incorporated by reference herein in their entirety.

BACKGROUND

An antenna (such as a dipole antenna) typically generates radiation in a pattern that has a preferred direction. For example, the generated radiation pattern is stronger in some directions and weaker in other directions. Likewise, when receiving electromagnetic signals, the antenna has the same preferred direction. Signal quality (e.g., signal to noise ratio or SNR), whether in transmitting or receiving scenarios, can be improved by aligning the preferred direction of the antenna with a direction of the target or source of the signal. However, it is often impractical to physically reorient the antenna with respect to the target or source of the signal. Additionally, the exact location of the source/target may not be known. To overcome some of the above shortcomings of the antenna, a phased array antenna can be formed from a set of antenna elements to simulate a large directional antenna. An advantage of a phased array antenna is its ability to transmit and/or receive signals in a preferred direction (e.g., the antenna's beamforming ability) without physical repositioning or reorientating.

It would be advantageous to configure phased array antennas having increased bandwidth while maintaining a high ratio of the main lobe power to the side lobe power. Likewise, it would be advantageous to configure phased array antennas and/or associated circuitry to operate together as to reduce signal degradation or introduction of signal errors. It would be further advantageous to configure phased array antennas and/or associated circuitry having reduced weight, reduced size, lower manufacturing cost, and/or lower power requirements. Accordingly, embodiments of the present disclosure are directed to these and other improvements in phased array antenna systems or portions thereof.

BRIEF DESCRIPTION OF THE DRAWINGS

The foregoing aspects and many of the attendant advantages of the present disclosure will become more readily appreciated as the same become better understood by reference to the following detailed description, when taken in conjunction with the accompanying drawings, wherein.

DETAILED DESCRIPTION

Figure 1:
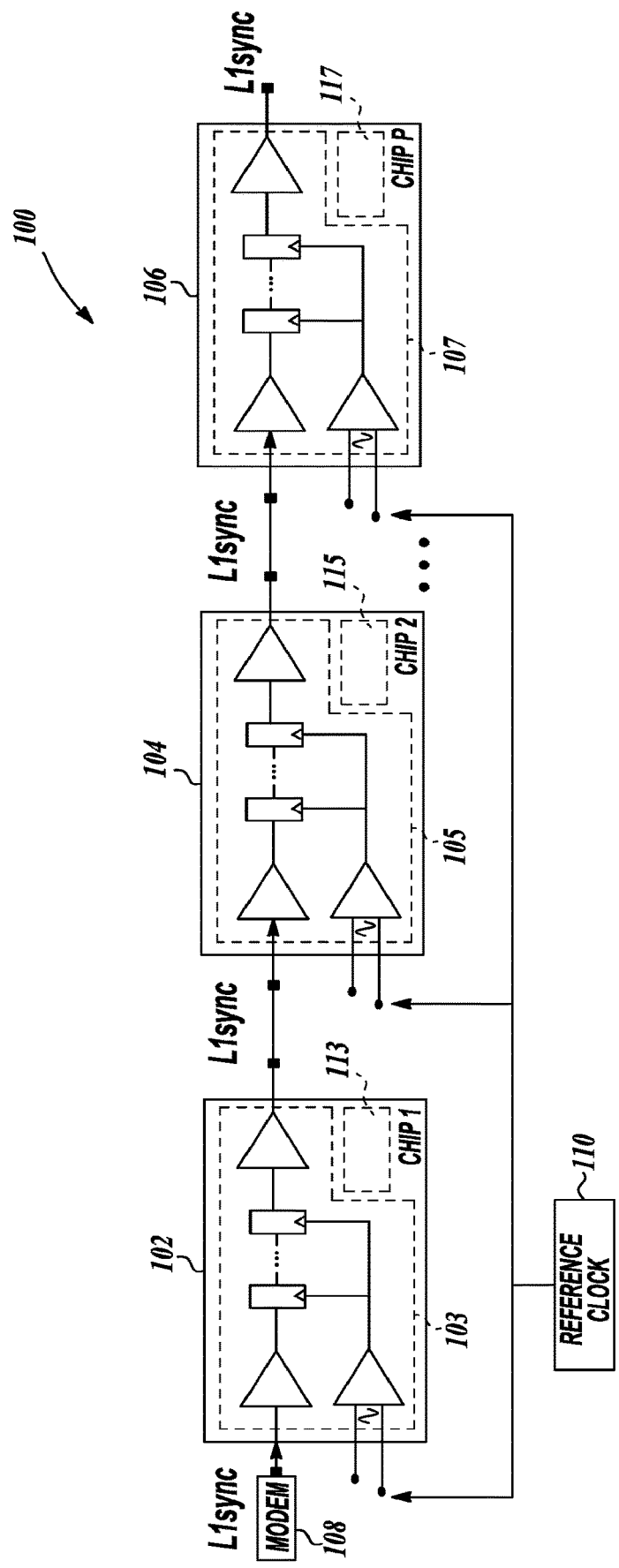
FIG. 1 is an example illustration of a block diagram showing a daisy chain of integrated circuit (IC) chips configured to facilitate timing signal distribution in accordance with some embodiments of the present disclosure.

Embodiments of apparatuses and methods disclosed herein relate to phase lock loop (PLL) synchronization. In an embodiment, an apparatus includes a first integrated circuit (IC) chip configured to receive a timing signal and a reference clock signal; a second IC chip configured to receive the timing signal from the first IC chip and the reference clock signal; and a third IC chip configured to receive the timing signal from the second IC chip and the reference clock signal. The second IC chip is electrically coupled between the first and third IC chips. The first, second, and third IC chips include respectively first, second, and third phase lock loop (PLL). The first, second, and third IC chips are configured to generate respective first, second, and third reference time signals based on the timing signal and the reference clock signal. The first, second, and third PLLs are synchronized to each other based on the respective first, second, and third reference time signals. These and other aspects of the present disclosure will be more fully described below.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

Language such as "top surface", "bottom surface", "vertical", "horizontal", and "lateral" in the present disclosure is meant to provide orientation for the reader with reference to the drawings and is not intended to be the required orientation of the components or to impart orientation limitations into the claims.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, it may not be included or may be combined with other features.

Many embodiments of the technology described herein may take the form of computer- or processor-executable instructions, including routines executed by a programmable computer, processor, controller, chip, and/or the like. Those skilled in the relevant art will appreciate that the technology can be practiced on computer/controller systems other than those shown and described above. The technology can be embodied in a special-purpose computer, controller, or processor that is specifically programmed, configured or constructed to perform one or more of the computer-executable instructions described above. Accordingly, the terms "computer," "controller," "processor," or the like as generally used herein refer to any data processor and can include Internet appliances and hand-held devices (including palmtop computers, wearable computers, cellular or mobile phones, multi-processor systems, processor-based or programmable consumer electronics, network computers, mini computers, and the like). Information handled by these computers can be presented at any suitable display medium, including an organic light emitting diode (OLED) display or liquid crystal display (LCD).

FIG. 1 is an example illustration of a block diagram showing a daisy chain of integrated circuit (IC) chips configured to facilitate timing signal distribution in accordance with some embodiments of the present disclosure. Each chip of the plurality of IC chips 100 is identical or similar to each other. Each chip of a plurality of IC chips 100 is serially or sequentially electrically coupled with each other, thereby forming a daisy chain of chips. The plurality of IC chips 100 comprises P number of chips. A chip 102 (denoted as chip 1 or the first chip), a chip 104 (denoted as chip 2 or the second chip), and a chip 106 (denoted as chip P or the last chip) of the plurality of IC chips 100 are shown in FIG. 1.

A modem 108 is configured to provide a timing signal, also referred to as L1sync, to chip 102. The timing signal comprises a low frequency synchronization signal that has a square wave or a step wave shape. A reference clock 110 is configured to provide a reference clock signal to each chip of the plurality of IP chips 100. The reference clock signal comprises a differential sinusoidal wave signal or a single-ended sinusoidal signal. In response, circuitry 103 included in chip 102 is configured to distribute or share the timing signal with the next chip in the daisy chain, namely, chip 104. Circuitry 103 includes one or more amplifiers, amplifiers/buffers, flip-flops, and/or other electrical components arranged as shown in FIG. 1. In some embodiments, a signal pathway length between adjacent chips may be in the order of approximately 10 centimeter (cm).

Circuitry 105 included in chip 104, in turn, distributes the timing signal (L1sync) received from chip 102 to the next chip in the daisy chain (e.g., to chip 3). The nth chip distributes the timing signal L1sync to the n+1th chip, including to the last chip 106 including circuitry 107 similar to circuitry 103, 105.

Hence, the same timing signal L1sync is distributed to each chip of the plurality of IC chips 100. The timing signal L1sync is respectively distributed among the chips 100 with a predictable or known link—a predictable chip-to-chip distance. When modem 108 generates the next timing signal, such timing signal is similarly distributed from chip 1, chip 2, and so forth, to chip P as described above.

In some embodiments, each chip of the plurality of IC chips 100 also includes circuitry or components configured to use the timing signal L1sync. For instance, without limitation, circuitry/component sections 113, 115, and 117 included in respective chips 102, 104, and 106 may use the timing signal L1sync.

Figure 2A:
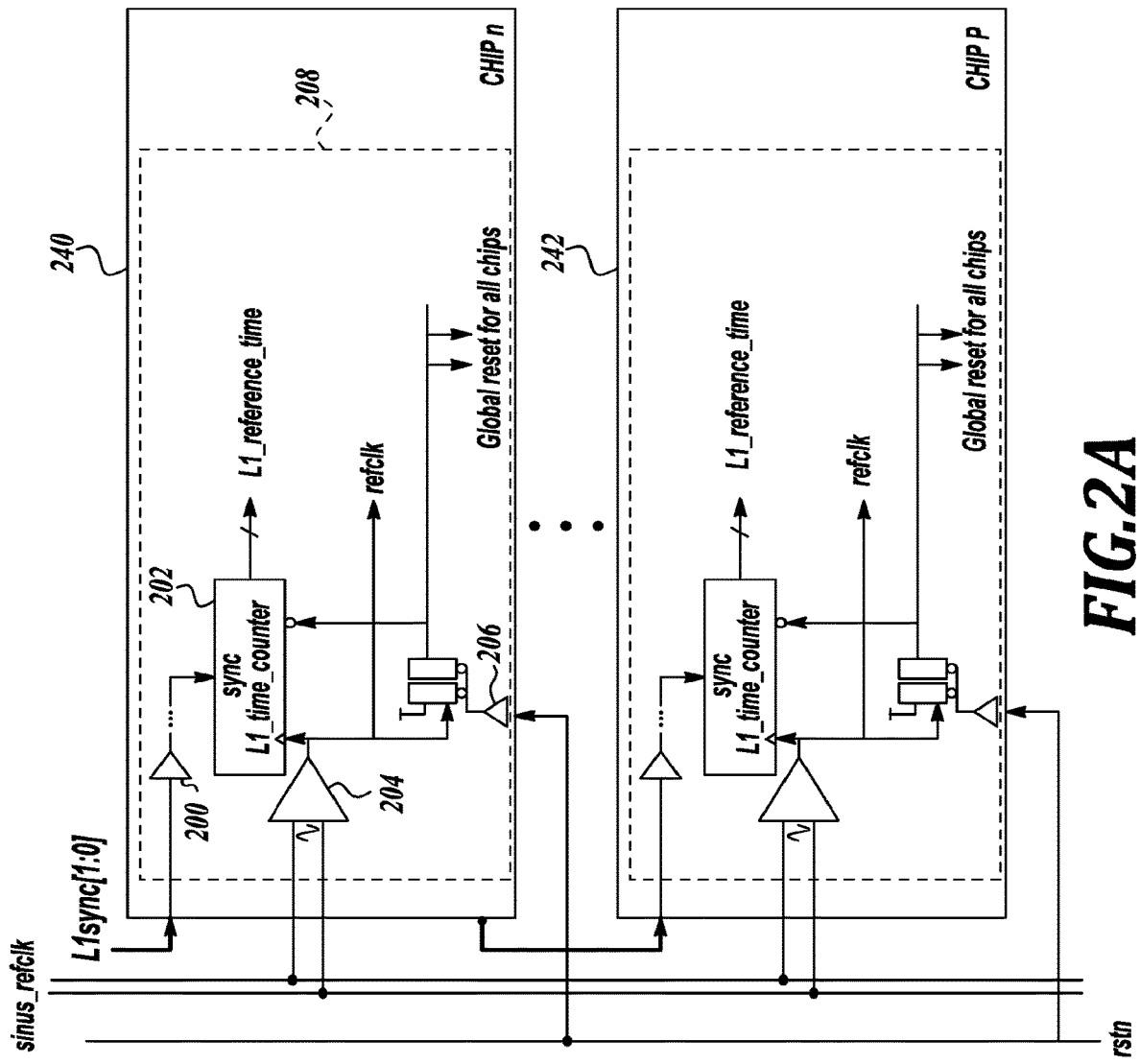
FIG. 2A is an example illustration of a block diagram showing generation of a first level reference time in each chip of the plurality of IC chips in accordance with some embodiments of the present disclosure.
Figure 2B:
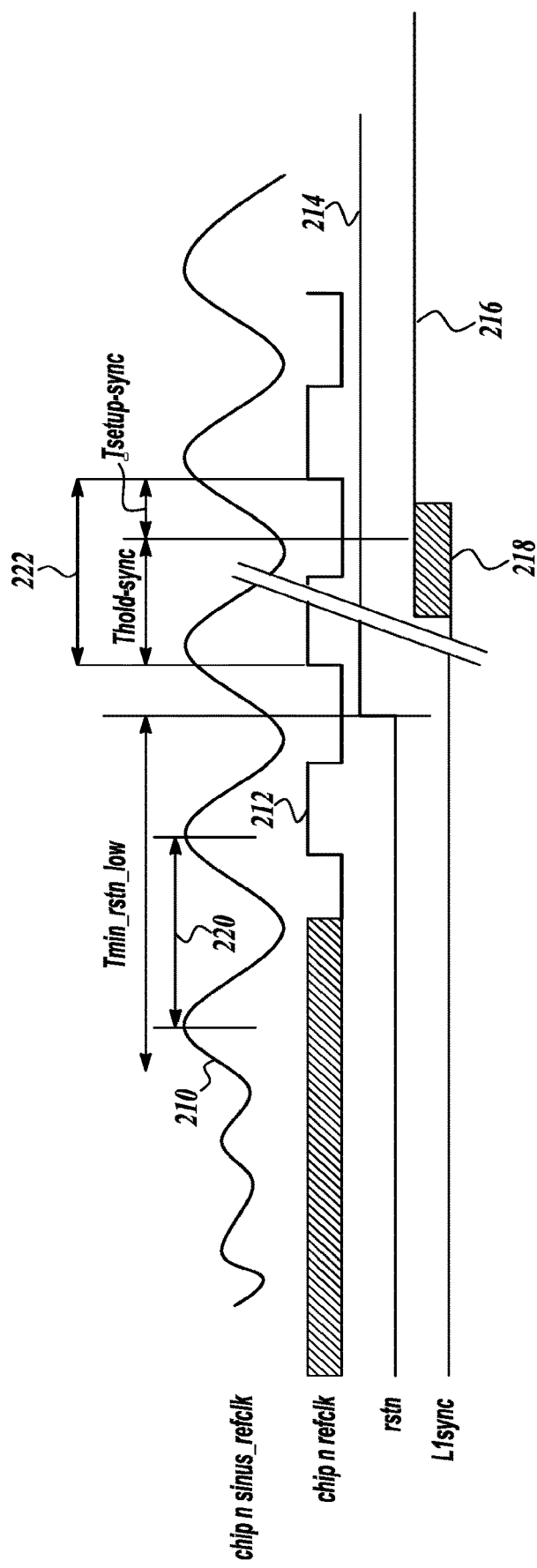
FIG. 2B is an example illustration of a waveform diagram associated with generation of the first level reference time in each chip in accordance with some embodiments of the present disclosure.

FIG. 2A is an example illustration of a block diagram showing generation of a first level reference time in each chip of the plurality of IC chips 100 in accordance with some embodiments of the present disclosure. FIG. 2B is an example illustration of a waveform diagram associated with generation of the first level reference time in each chip in accordance with some embodiments of the present disclosure. Referring to FIG. 2A, chips 240 and 242 comprise chips of the plurality of IC chips 100 arranged in a daisy chain arrangement. Chip 240 may comprise the nth chip (where n<P) and chip 242 may comprise the Pth or last chip in the daisy chain arrangement. In some embodiments, chips 240, 242 may be similar to respective chips 104, 106.

Each chip of the plurality of IC chips 100 includes one or more circuitry or component sections. For example, without limitation, chip 240 includes a circuitry section similar to circuitry 105 (not shown in FIG. 2A) and a circuitry/ component section 208. If chip 240 comprises chip 104 of FIG. 1, then section 208 comprises section 115. Chip 240 receives the timing signal (L1sync) from the immediately preceding chip (the n−1th chip), the reference clock signal (sinus_refclk) from the reference clock 110, and a reset signal from modem 108. Chip 240 is configured to distribute the timing signal (L1sync) to the next chip (the n+1th chip) as described above in connection with FIG. 1. Chip 240 is further configured to generate a first level reference time signal (L1_reference_time). Each chip of the plurality of IC chips 100 may include circuitry and/or components such as circuitry 105 and section 208.

In some embodiments, section 208 included in chip 240 is configured to receive the timing signal (L1sync) from the immediately preceding chip at a subsection 200, perform appropriate signal processing (e.g., signal amplification, buffering, etc.) within subsection 200, and provide the timing signal to a counter 202. The reference clock signal (sinus_refclk) is received by an amplifier/buffer 204 included in section 208. In some embodiments, amplifier/buffer 204 is configured to convert the reference clock signal, which has a sinusoidal waveform shape, into a converted reference clock signal (refclk) having a square waveform. The amplifier/buffer 204 may be part of a Schmitt trigger circuit, for example, to perform the waveform shape conversion. The converted reference clock signal is also an input to counter 202. The reset signal (rstn) is an input to subsection 206 included in section 208, which processes the reset signal as necessary, and then provides the (processed) reset signal as an input to counter 202.

Although not shown, section 208 can further include associated electrical components and/or elements such as, but not limited to, buffers, digital flops, passive electrical elements, resistors, inductors, capacitors, feedback loops, and/or the like to process one or more of the input signals (e.g., timing signal, reference clock signal, reset signal) into formats suitable to be inputs to the counter 202.

As shown in FIG. 2B, the reference clock signal (sinus_refclk) is represented as a waveform 210 having a sinusoidal wave shape. As an example, the reference clock signal can have a frequency in the range of a few Megahertz (MHz) to a few hundred MHz. The reference clock signal comprises a continuous signal having a constant periodicity. Waveform 212, having a square wave shape, represents the converted reference clock signal (refclk). The converted reference clock signal retains the same period as the reference clock signal (e.g., both waveforms 210 and 212 have the same period 222). Waveform 214 having a step (or square) wave shape comprises the reset signal. Waveform 216 having a step (or square) wave shape comprises the timing signal (L1sync). As an example, the period associated with the timing signal may be a few kilohertz (kHz).

Counter 202, also referred to as a L1_time_counter, is configured to generate and output the first level (L1) reference time signal based on the timing signal, converted reference clock signal, and reset signal. The first level reference time signal is also referred to as L1_reference_time, a L1 reference timing signal, or the like. Counter 202 is configured to count the number of cycles, periods, or pulses of the converted reference clock signal received starting from a particular point in time as specified by the timing signal (L1sync). The timing signal (L1sync) changing to a high (or is at a rising edge) can comprise the particular point in time at which counter 202 is triggered to start counting the converted reference clock signal. This count is specified in the first level reference time signal. Because counter 202 continuously counts the number of cycles/periods/pulses of the converted reference clock signal, the first level reference time signal correspondingly provides the present or real-time count value.

In some embodiments, counter 202 counts during the timing signal's period and automatically resets to zero to start counting again starting at the point in time at which the next rising edge (or high) of the timing signal occurs. Thus, the count performed by counter 202 follows or tracks the periodicity of the timing signal (L1sync).

In some embodiments, counter 202 can, in addition and/or in the alternative, be configured to reset to a zero count (e.g., if a rising or falling edge of the reset signal is detected or if the reset signal is in a low state) or to continue counting (e.g., if the reset signal is not at a rising/falling edge or the reset signal in a high state) based on the particular state of the reset signal. The same (state of the) reset signal (waveform 214) is provided to each chip of the plurality of IC chips 100. The same (state of the) reference clock signal (waveform 210) is also provided to each chip of the plurality of IC chips 100. The timing signal (waveform 216) is provided to all chips of the plurality of IC chips 100 via the daisy chain arrangement described above. The same timing signal (or state of the timing signal) is received by all of the chips 100 within a single period of the reference clock signal.

For example, the rising edge of waveform 214 (reset signal) shown in FIG. 2B specifies to the counter 202 to reset its counter. The rising edge or a high state of waveform 216 (timing signal) (e.g., portion 218 of waveform 216) is configured to occur and be received by all of the chips 100 within a same single period (e.g., period 222) of waveform 212 (converted reference clock signal). Portion 218 of waveform 216 comprises the trigger or identification of a particular time point from which the counter 202 is to start counting. Portion 218 is configured not to violate any set up and/or hold constraints associated with the chip. Accordingly, detection of the particular period 222 of the converted reference clock signal causes counter 202 to increment by one so that the count now equals one. Alternatively, the period immediately after the particular period 222 may cause counter 202 to increment by 1 so that the count now equals one. In any case, all of the chips 100 are configured to conform to the same counter increment triggering convention. Counter 202 continues to increment with each successive cycle/period of the converted reference clock signal until a particular change to the reset signal is detected.

A counter included in each of the remaining chips 100 simultaneously performs the same counting function based on the same input signals. Thus, the first level reference time signals outputted by the counters of all of the chips 100 specify the same count value at each time point. The first level (L1) counters are synchronized between the chips of the plurality of IC chips 100. The same count value specified by the first level reference time signals across all of the chips 100 can be used as a common or synchronized reference time for the chips 100 to synchronize or simultaneously perform one or more particular operations/actions in more than one chip of the plurality of IC chips 100. For instance, when the first level reference time signal is at a count of 5,000, a first particular operation is to be performed in each chip of the plurality of IC chips 100; when the first level reference time signal is at a count of 10,005, a second particular operation is to be performed by chip 1, chip 2, and chip 40; when the first level reference time signal is at a count of 50,500, a third particular operation is to be performed by all of chips 100; and the like.

Figure 3:
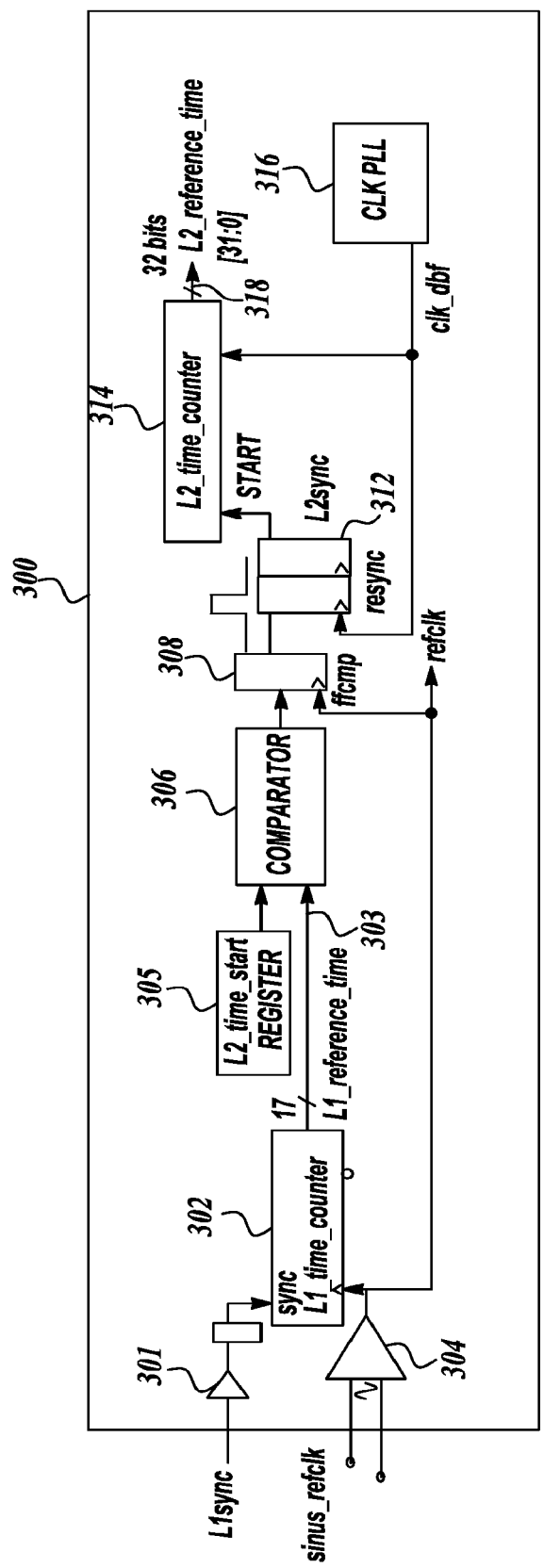
FIG. 3 is an example illustration of a block diagram showing generation of a second level reference time in a chip in accordance with some embodiments of the present disclosure.

FIG. 3 is an example illustration of a block diagram showing generation of a second level reference time in a chip in accordance with some embodiments of the present disclosure. In some embodiments, each of the chips 100 can include circuitry/components such as circuitry 105 associated with distribution of the timing signal L1sync in the daisy chain arrangement and a section 300 to generate a second level reference time signal. Section 300 can comprise section 113, 115, or 117 of FIG. 1. The second level reference time signal is also referred to as an L2_reference_time, a L2 reference timing signal, or the like. The second level reference time signal comprises a higher resolution reference time based on the first level reference time signal. Thus, the first level reference time signal may be considered to be a coarse (resolution) reference time and the second level reference time signal may be considered to a fine or (higher resolution) reference time.

Section 300 is configured to generate and output the second level reference time signal (L2_reference_time) based on the timing signal (L1sync) and the reference clock signal (sinus_refclk). In section 300, subsection 301, first level counter 302, and amplifier/buffer 304 are similar to respective subsection 200, counter 202, and amplifier/buffer 204 of FIG. 2A. Timing signal (L1sync) is an input to the first level counter 302. The converted reference clock signal (refclk) generated by amplifier/buffer 304 comprises an input to each of the first level counter 302 and flip flop 308. The first level reference time signal (L1_reference_time) and output of a second level register 305 comprise the inputs to a comparator 306. The second level register 305, also referred to as a L2_time_start register, is configured to store or specify a particular first level reference time signal count value (e.g., a pre-defined count value) associated with triggering actuation of a second level counter 314.

Comparator 306 is configured to determine if the count value specified by the first level reference time signal at least equals (is equal to or greater than) the pre-defined count value specified in the second level register 305. Flip flops 308 and 312 provided at the output of the comparator 306 are configured to generate a second level reference time start signal (L2sync) in accordance with the determination made by the comparator 306. If the comparator 306 determines that the two count values are at least equal to each other, then the second level reference time start signal is configured to have a rising edge without delay, to specify a trigger similar to portion 218 shown in FIG. 2B but for triggering start of counting by the second level counter 314. If the comparator 306 determines that the two count values are not at least equal to each other (that the first level reference time signal count value is less than the second level register 305 pre-defined count value), then the second level reference time start signal is configured to not include a rising edge. The second level reference time start signal is analogous to the timing signal L1sync for the first level counter 302 or 202 but instead for the second level counter 314. The second level reference time start signal is also referred to as a start signal, a second level timing signal, L2sync, and/or the like.

In some embodiments, flip flop 308 may be configured to generate an initial signal with a rising edge in accordance with the determination made by the comparator 306, and flip flops 312 may be configured to detect the rising edge included in the initial signal and generate a final signal indicative of the detected rising edge to the second level counter 314. The final signal to the second level counter 314 comprises the start signal, L2sync signal, and/or second level reference time start signal. The first pulse of the start signal starts or triggers the second level counter 314.

Another input to the second level counter 314 comprises a reference digital clock signal (clk_dbf) from a reference clock phase lock loop (CLK PLL) 316. In some embodiments, this digital clock signal (clk_dbf) comprises a sinusoidal waveform having a frequency of N times that of the reference clock signal (sinus_refclk). Digital clock signal (clk_dbf) is analogous to reference clock signal (sinus_refclk) inputted to the first level counter 302/202, except due to its higher frequency, the period or cycle of digital clock signal (clk_dbf) is smaller than that of the reference clock signal (sinus_refclk) and thereby provides a better time resolution. The smaller periodicity of digital clock signal (clk_dbf), in turn, permits finer/smaller time resolution counting than associated with L1_reference_time and the first level counter 202/302 alone. Digital clock signal (clk_dbf) from CLK PLL 316 is also an input to the flip flops 312 to facilitate generation of L2sync to reset or resynchronize the second level counters in all of the chips 100.

Second level counter 314, also referred to as a L2_time_counter, is configured to start counting the number of periods or cycles of the digital clock signal (clk_dbf) starting from a trigger or start time point specified by the second level reference time start signal. In some embodiments, a rising edge detection in the first pulse of the second level reference time start signal (L2sync) comprises the trigger or start of counting by the second level counter 314. The output of the second level counter 314 comprises the second level reference timing signal (L2_reference_time), which specifies the present or real-time count value. Once the second level counter 314 starts counting, the counter is free running and the next pulses of the second level reference time start signal do not reset or reinitialize the counter until another trigger from flip flop 308 is issued.

In an embodiment, without limitation, the second level reference timing signal (L2_reference_time) may comprise 32 bits, and may be stored in memory locations [31:0]. As an example, the second level reference timing signal (L2_reference_time) can be used to synchronize data read or write buffers or registers located in more than one chip of the plurality of IC chips 100 or otherwise synchronize performance of particular operations/actions at particular clock cycles across the chips 100.

Figure 4A:
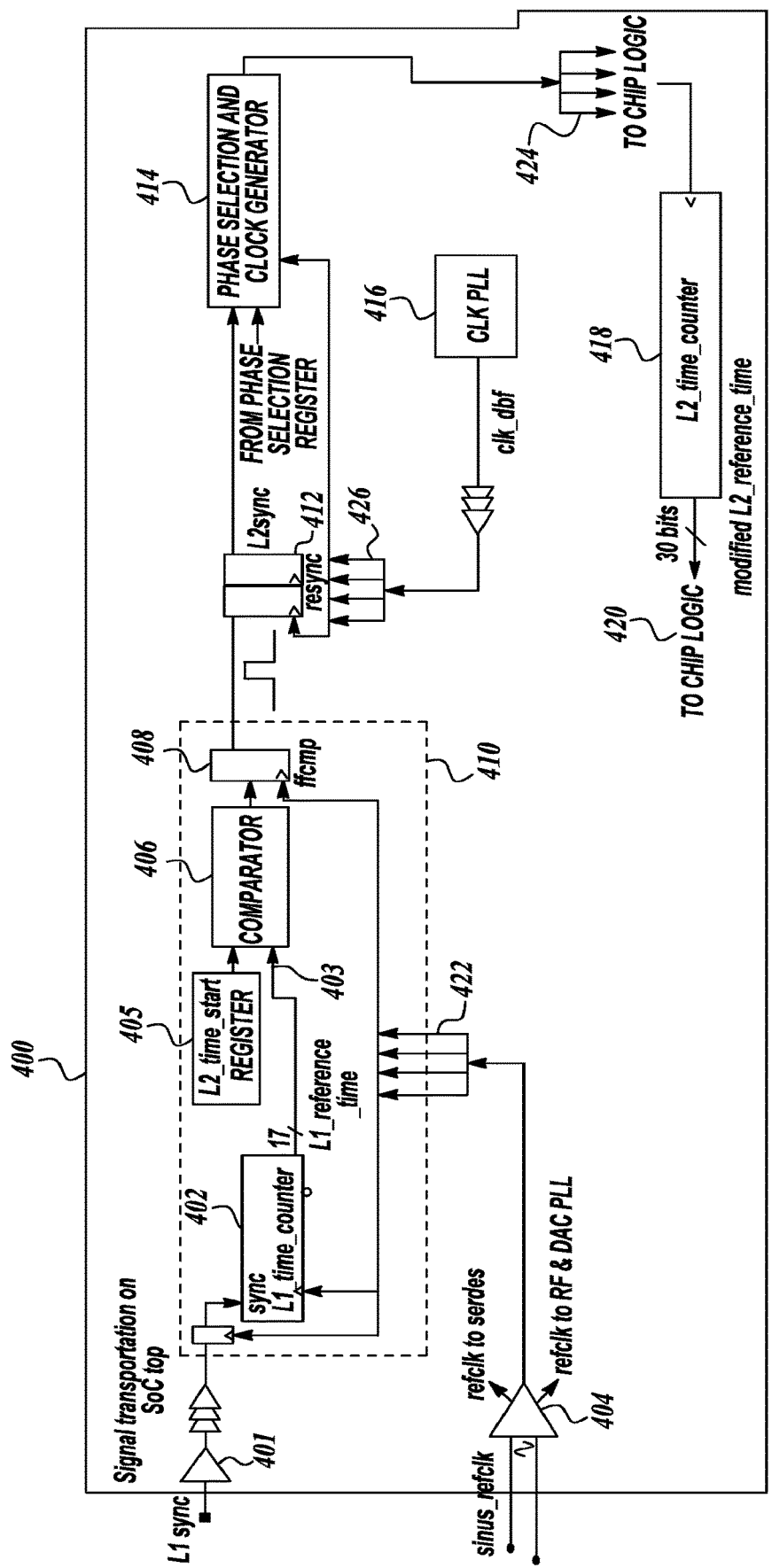
FIG. 4A is an example illustration of a block diagram showing generation of a modified second level reference time in a chip in accordance with some embodiments of the present disclosure.

FIG. 4A is an example illustration of a block diagram showing generation of a modified second level reference time in a chip in accordance with some embodiments of the present disclosure. In some embodiments, each of the chips 100 can include circuitry/components such as circuitry 105 associated with distribution of the timing signal L1sync in the daisy chain arrangement and a section 400 to generate a modified second level reference time signal. Section 400 can comprise section 113, 115, or 117 of FIG. 1. The modified second level reference time signal is also referred to as a modified L2_reference_time, a modified L2 reference timing signal, a L2'_reference_time, a L2' reference timing signal, or the like. The modified second level reference time signal comprises a higher resolution reference time based on the first level reference time signal. Thus, the first level reference time signal may be considered to be a coarse (resolution) reference time and the modified second level reference time signal may be considered to a fine or (higher resolution) reference time.

In some embodiments, the count resolution per time offered by the modified second level reference time is the same as with the second level reference time. The second level reference time may be referred to as a first level L2_reference_time and the modified second level reference time may be referred to as a second level L2_reference_time. Second level reference time or modified second level reference time may be generally referred to as L2 time.

In some embodiments, the second level reference time signal outputted by second level counter 314 may not be ideal for use in a different frequency environment associated with at least a portion of a chip. The second level reference time signal is based on a different frequency clock signal (clk_dbf) than the frequency environment associated with the at least a portion of the chip (e.g., the frequency associated with the clock signal used within the at least portion of the chip). A latency mismatch of the clock trees associated with the respective different frequencies can occur. The modified second level reference time generated in section 400 has a resolution, for example, that is four times better than the period of the clock signal (clk_dbf). This is achieved by controlling the initial phase of the clock signal (clk_dbf) applied to the modified second level counter 418 without the need for the clock signal (clk_dbf) to be at a higher frequency than it is. Section 400 may be implemented instead of section 300 in such a chip to retain the higher resolution possible with the second level time signal without latency mismatch.

Section 400 is configured to output the modified second level reference time signal based on the timing signal (L1sync) and the reference clock signal (sinus_refclk). In section 400, a subsection 401, first level counter 402, amplifier/buffer 404, second level register 405, comparator 406, and flip flop 408 are similar to respective subsection 301, first level counter 302, amplifier/buffer 304, second level register 305, comparator 306, and flip flop 308 of FIG. 3.

In some embodiments, converted reference clock signal (refclk) generated by amplifier/buffer 404 comprises the input to a clock tree 422. The clock tree 422, also referred to as a low latency clock tree, comprises a plurality of flip flops. Clock tree 422 is configured to split the converted reference clock signal (refclk) into a plurality of split signals, in which each signal of the plurality of split signals comprises a signal phase shifted by a certain amount. Split signals are provided to various components included in a subsection 410 such as, but not limited to, the first level counter 402 and flip flop 408.

First level counter 402, second level register 405, comparator 406, flip flop 408, and associated flip flops included in subsection 410 may be physically located proximate to each other to reduce clock tree latency.

A start signal (L2sync) outputted from flip flops 408, 412 is similar to the start signal outputted from flip flops 308, 312. The start signal (L2sync) comprises an input to a phase selection and clock generator 414.

A CLK PLL 416 is configured to generate a digital clock signal (clk_dbf) having, for example, a frequency of N times the frequency of the reference clock (sinus_refclk). CLK PLL 416 is similar to CLK PLL 316. The digital clock signal (clk_dbf) from CLK PLL 416 comprises the input to a clock tree 426. Clock tree 426, also referred to as a low latency clock tree, comprises a plurality of flip flops configured to split the input signal into a plurality of split signals to provide to flip flops 412 and generator 414 with low latency. Clock tree 426 may be similar to clock tree 422. In some embodiments, flip flops 412 and generator 414 are physically located proximate to each other to reduce clock tree latency.

Another input to generator 414 comprises selectable phase(s) from a phase selection register or similar component. The phase(s) is selected based on 360/N, where the resolution of phase selection is based on N*frequency of the clock signal (clk_dbf). This means the modified second level counter 418 can start counting with a resolution N times higher than the period of the clock signal (clk_dbf). Generator 414 is configured to generate the new digital clock signal in the same reference clock domain as the chip (or chip portion) in which the clock signal counts is to be used in accordance with the digital clock signal (clk_dbf) and selected phase(s). Generator 414 is configured to generate a new digital clock signal having a frequency which is the same as the clock signal (clk_dbf), but the phase can be programmed with a resolution that is N times better or higher. Generator 414 comprises a multi-phase programmable divider. Generator 414 may also be referred to as a phase selection and clock generation module.

For instance, the phase selection in generator 414 may be a 1080 MHz clock signal, while the reference clock domain of the chip (or chip portion) of interest is a 270 MHz environment (e.g., the reference clock of the chip/system clocks in at 270 MHz). A phase selection of 90 degree increments (or phase selections of 90, 180, 270, and 360 degrees) of 1080 MHz is inputted to generator 414. In response, the generator 414 generates a new digital clock signal at 270 MHz, corresponding to one of the four selected phases of 1080 MHz. The 270 MHz frequency of the new digital clock signal has the correct phase to be used as the digital clock of the chip (or chip portion) of interest.

The output of generator 414 comprises the input to a clock tree 424. Clock tree 424 comprises a high latency clock tree having a greater number of flip flops than either of clock trees 422 or 426. Clock trees 426 and 422, by contrast, each comprises a low latency clock tree having a relatively small number of flip flops. Clock tree 424 is configured to generate a plurality of split signals (e.g., four split signals) based on new digital clock signal generated by generator 414.

The split signal(s) comprise the input to the modified second level counter 418. Modified second level counter 418 is configured to duplicate the fine count resolution capability of the second level counter 314, except the output of modified second level counter 418 comprises a modified second level reference time signal that is configured for use in the digital clock domain of the chip (or chip portion) of interest. The modified second level counter 418 is clocked by the new digital clock signal and generates the modified second level reference time signal that is indicative of sub-periods or phase increments of the new digital clock signal in accordance with the phase selection inputted to the generator 414.

Continuing the above example, the counter 418 increments by one for each successive 90 degree phase of the new digital clock signal, for a total of four counts per period of the new digital clock signal. In contrast, the second level counter 314 is clocked by the digital clock signal (clk_dbf) and the count increments by one for each period of the digital clock signal (clk_dbf). Modified second level counter 418 is also referred to an L2_time_counter or a second level L2_time_counter.

Figure 4B:
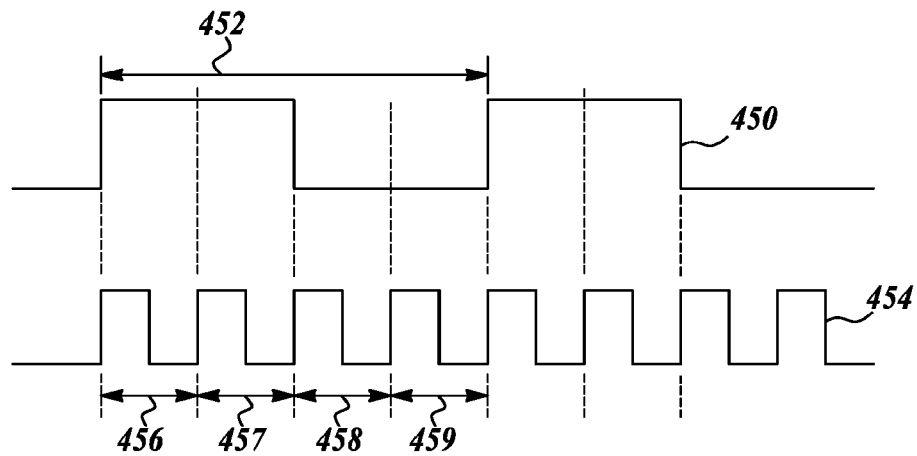
FIG. 4B illustrates example clock signals in accordance with some embodiments of the present disclosure.

In an embodiment, the modified second level reference time signal comprises a count value that is the same as would be for the second level reference time signal outputted from counter 314. FIG. 4B illustrates example clock signals in accordance with some embodiments of the present disclosure. Clock signals 450 and 454 represent clock or reference signals associated with different frequency clock domains or environments. In FIG. 4B, clock signal 454 has a frequency that is 4 times greater than that of clock signal 450. Within the time duration of a single period 452 of clock signal 450, four periods 456, 457, 458, and 459 of clock signal 454 occur. In other words, for every 90 degree phase (e.g., ¼ period) of clock signal 450, a single period or cycle of clock signal 454 occurs. Counting each period/cycle of clock signal 454 is equivalent to counting each successive 90 degree phase or ¼ period portion of clock signal 450.

Accordingly, if clock signal 450 is counted in 90 degree phase or ¼ period increments (instead of by each full period or cycle), then the count value associated with clock signal 450 can be the same as the count value associated with clock signal 454. Such count value associated with clock signal 450 is at a higher resolution than the periodicity of clock signal 450. Each period of clock signal 450 increments the counter by more than one (e.g., counter increments by four). For sub-period counting scheme, clock signal 454 can be used and permits the count value to be used in an environment where clock signal 450 comprises the clocking or reference signal and/or where, in the same environment, a higher or finer resolution count than the periodicity of clock signal 450 may be required to perform certain actions.

As an example, without limitation, clock signal 450 may be an example of the new digital clock signal generated by generator 414 and clock signal 454 may be an example of the higher frequency clock signal (clk_dbf) from CLK PLL 416. The modified second level counter 418 is configured to provide an initial phase with a resolution that is smaller or finer than a period of the new digital clock signal.

It is understood that the sub-period phase accuracy scheme described above can be implemented in less or greater than four phases per period. For instance, without limitation, generator 414, phase selection register, and/or clock tree 424 can be configured so that each 45 degree phase of the signal outputted by generator 414 increments the count in counter 418, for a total of eight counts per signal period.

The modified second level reference time signal outputted by the modified second level counter 418 is used to synchronize and/or sequence certain actions in certain components/logic 420 included in chip(s).

Figure 4C:
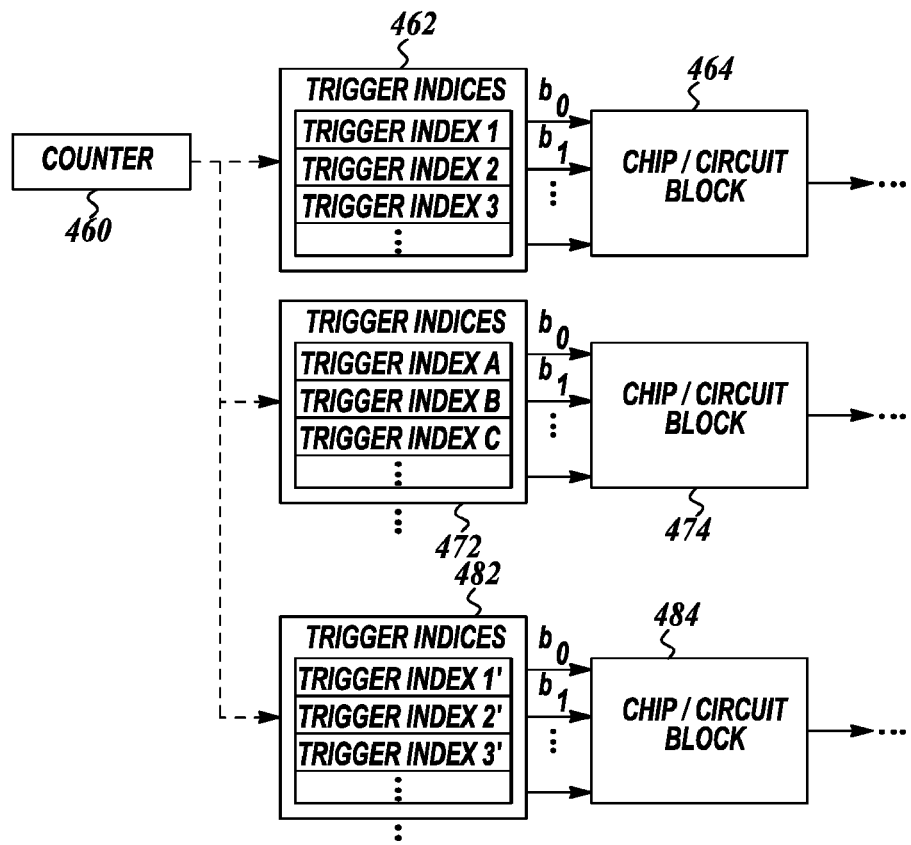
FIG. 4C illustrates a block diagram showing an example use of the first level reference time signal, second level reference time signal, or modified second level reference time signal in accordance with some embodiments of the present disclosure.

FIG. 4C illustrates a block diagram showing an example use of the first level reference time signal, second level reference time signal, or modified second level reference time signal in accordance with some embodiments of the present disclosure. Counter 460 comprises any of counters 202, 314, or 418 which provides the first level reference time signal, second level reference time signal, or modified second level reference time signal, respectively. A plurality of chip/circuit blocks is associated with a plurality of trigger indices sets. In particular, chip/circuit blocks 464, 474, and 484 of the plurality of chip/circuit blocks are associated with respective look up tables (LUTs) 462, 472, and 482 of the plurality of LUTs. Chip/circuit blocks 464, 474, and 484 are examples of component/chip logic 420.

Each chip/circuit block of the plurality of chip/circuit blocks comprises at least a portion of a chip, circuit, or component. Chip/circuit blocks 464, 474, and 484 can be the same or different from each other. Chip/circuit blocks 464, 474, and 484 can be included in the same chip or in more than one chip. Each LUT of the plurality of LUTs maintains one or more pre-defined trigger indices, each trigger index defining a particular count value at which a particular action is to be taken by a particular chip/circuit block or a portion thereof. The trigger indices between LUTs can be the same or different from each other. LUTs 464, 474, and/or 484 can be the same or different from each other. In FIG. 4C, LUT 462 includes trigger indices 1, 2, 3, etc.; LUT 472 includes trigger indices A, B, C, etc.; and LUT 482 includes trigger indices 1', 2', 3', etc. Trigger indices 1, 2, 3, etc. included in LUT 462 comprise, at a minimum, all the trigger indices relevant for operation of chip/circuit block 464. Trigger indices A, B, C, etc. and trigger indices 1', 2', 3', etc. are likewise included as relevant for respective chip/circuit blocks 474, 484.

In some embodiments, the current count value from counter 460 (e.g., the first, second, or modified second level reference time signal) is provided to each of LUTs 462, 472, and 482. In response, each LUT (or associated processor component) determines whether the current count value is equal to a pre-defined count value associated with any of the trigger indices it maintains. If the current count value is equal to a pre-defined count value, then the chip/circuit block or portion thereof associated with that triggered index is actuated or otherwise commanded to perform a particular action. As an example, trigger index 1 of LUT 462 may specify triggering a write operation to register A in chip/circuit block 464 at a count value of 1000. If the current count value is 1000, then trigger index 1 would be triggered and the write operation to register A takes place.

In some embodiments, the trigger indices can be provided in a format other than in LUTs; LUTs 462, 472, and 482 may be combined into a single LUT; and/or the like.

Figure 5:
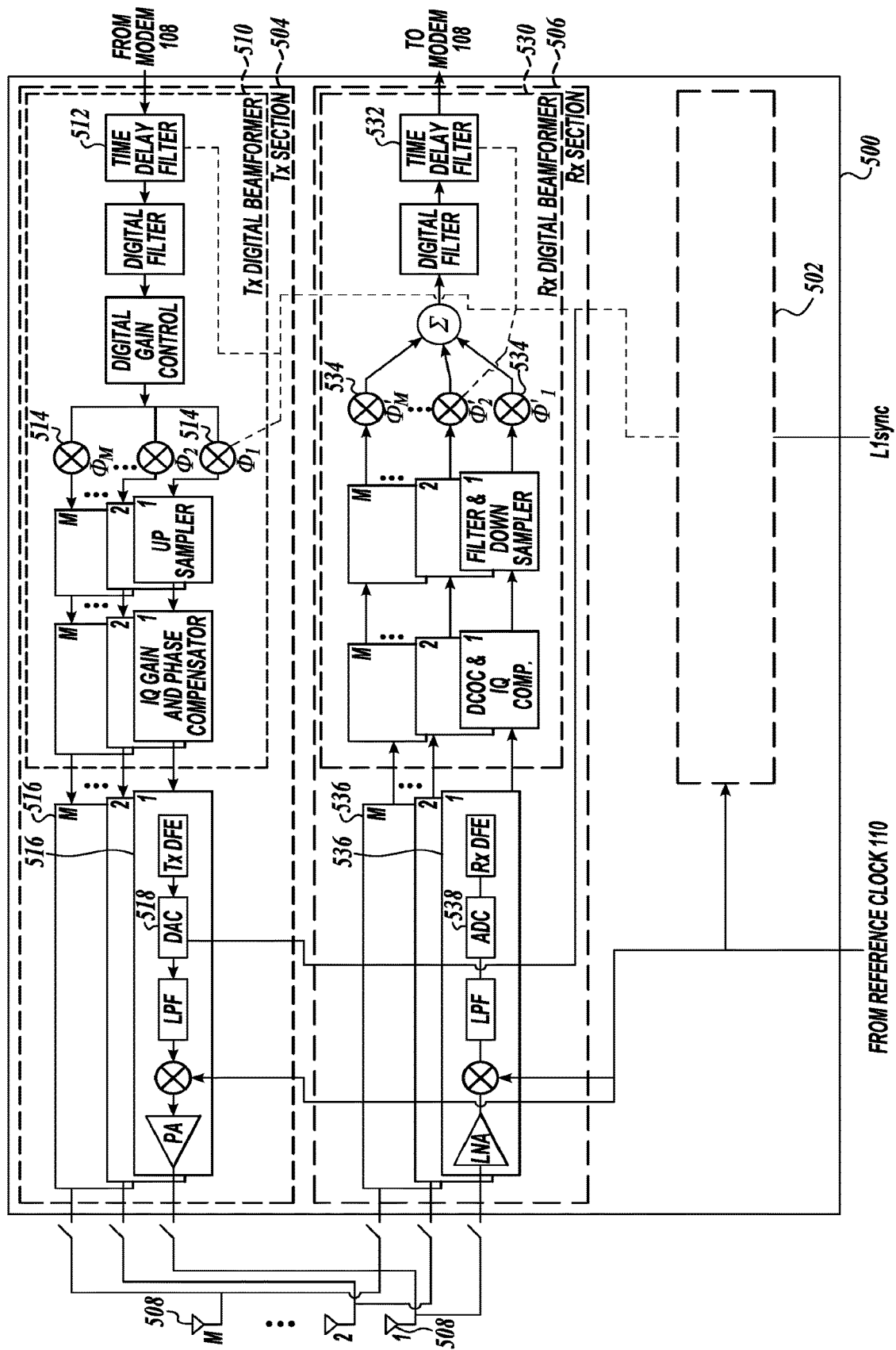
FIG. 5 is an example illustration of an IC chip included in the plurality of IC chips in accordance with some embodiments of the present disclosure.

FIG. 5 is an example illustration of an IC chip 500 included in the plurality of IC chips 100 in accordance with some embodiments of the present disclosure. Chip 500 comprises, for example, a digital beamformer (DBF) chip. Chip 500 includes, without limitation, a time synchronization section 502, a transmit section 504, a receive section 506, and a section to distribute the L1sync signal similar to section 105 (not shown). Section 504 and/or 506 (or a portion thereof) comprises an example of the components/logic 420.

Time synchronization section 502 comprises one of sections 208, 300, or 400. Time synchronization section 502 receives as inputs the reference clock signal from the reference clock 110 and the timing signal L1sync from the proceeding chip in the daisy chain arrangement (or modem 108 if chip 500 is the first chip in the daisy chain arrangement). Transmit section 504 is configured to receive data beam(s) from the modem 108 and configure the data beam(s) into a format suitable for transmission by a plurality of antenna elements 508. Transmit section 504 includes a digital baseband processing section 510 and a plurality of radio frequency (RF) processing sections 516.

Each of the sections 510 and 516, in turn, includes a plurality of electrical components or logic, one or more of which may be synchronized in operation between chips in the daisy chain arrangement via use of the first level, second level, or modified second level reference time signal (depending on particular reference time signal produced by section 502). For example, a time delay filter 512, plurality of phase shifters 514, DACs 518, and/or the like included in section 504 may be actuated or cause to perform its respective functions at particular count values of the reference time signal. The same components/logic in other chips of the plurality of IC chips 100 are actuated or caused to perform its functions at the same particular count values as in chip 500 via use of the respective reference time signals in the other chips.

Receive section 506 is configured to receive RF signals from the plurality of antenna elements 508 and process the RF signals to recover the underlying data beam(s) to provide to modem 108. Receive section 506 includes a digital baseband processing section 530 and a plurality of RF processing sections 536. Each of the sections 530 and 536, in turn, includes a plurality of electrical components or logic, one or more of which may be synchronized in operation between chips in the daisy chain arrangement via use of the first level, second level, or modified second level reference time signal (depending on particular reference time signal produced by section 502). For example, a time delay filter 532, plurality of phase shifters 534, analog-to-digital converters (ADCs) 538, and/or the like included in section 506 may be actuated or cause to perform its respective functions at particular count values of the reference time signal. The same components/logic in other chips of the plurality of IC chips 100 are actuated or caused to perform its functions at the same particular count values as in chip 500 via use of the respective reference time signals in the other chips.

In some embodiments, only one of sections 504 or 506 may be included in chip 500. The transmitter associated components can be implemented in the same or different chip as the chip including the receiver associated components.

Other examples of use of L2 time include, without limitation, synchronization and/or sequencing of operations involving DBFs, DAC first in first outs (FIFOs), calibration, and/or the like.

Figure 6:
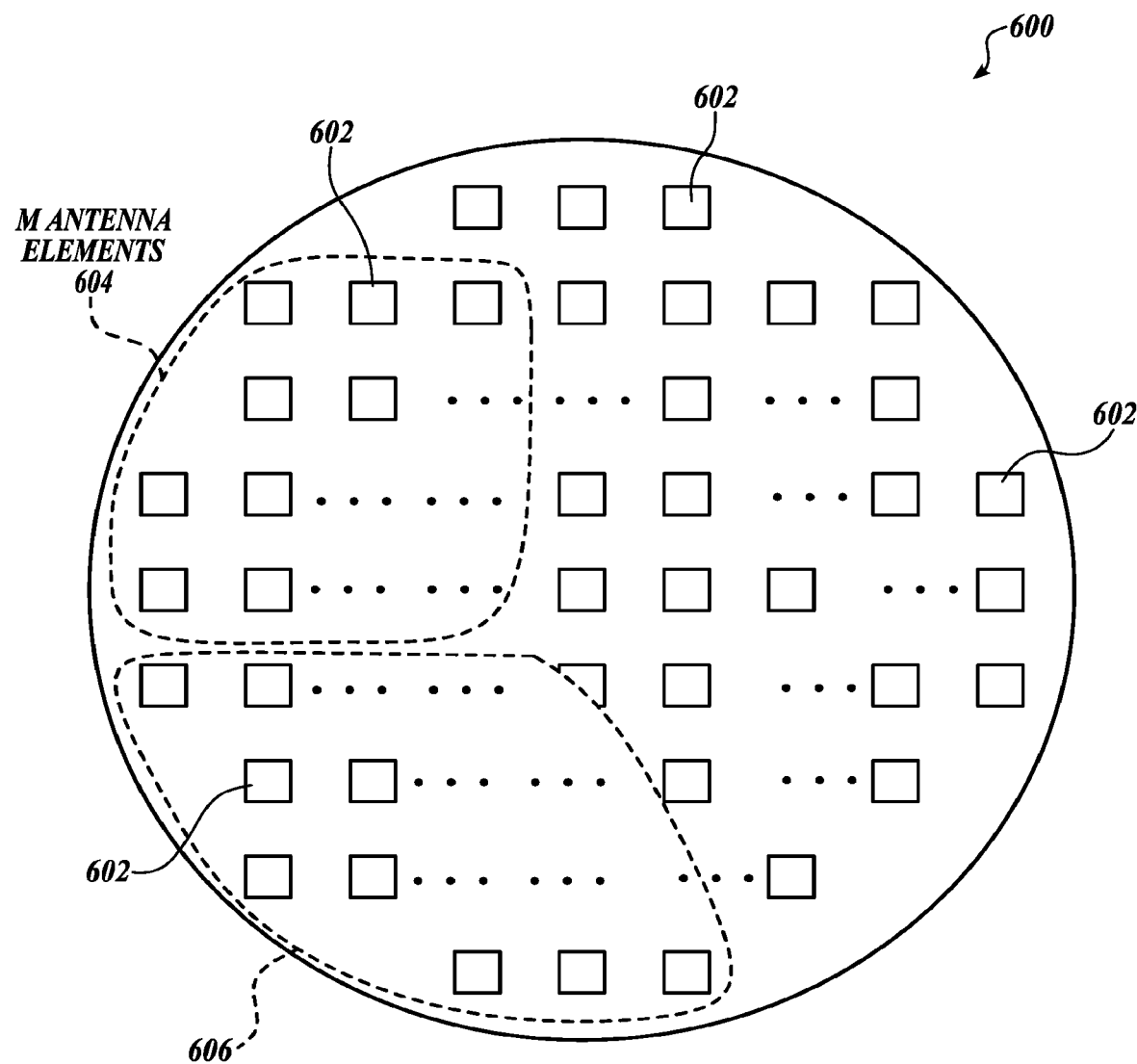
FIG. 6 is an example illustration of a top view of an antenna lattice in accordance with some embodiments of the present disclosure.

FIG. 6 is an example illustration of a top view of an antenna lattice 600 in accordance with some embodiments of the present disclosure. Antenna lattice 600 (also referred to as a phased array antenna) includes a plurality of antenna elements 602 arranged in a particular pattern to define a particular antenna aperture. The antenna aperture is the area through which power is radiated by or to the antenna elements 602. A phased array antenna synthesizes a specified electric field (phase and amplitude) across an aperture. Adding a phase shift to the signal received or transmitted by each antenna in an array of antennas allows the collective signal of these individual antennas to act as the signal of a single antenna.

A subset 604 of the plurality of antenna elements 602 can comprise the M antenna elements 508 associated with chip 500 and a subset 606 of the plurality of antenna elements 602 can comprise the M antenna elements associated with another chip of the plurality of IC chips 100. The remaining subsets of antenna elements of the plurality of antenna elements 602 may be similarly associated with the remaining chips of the plurality of IC chips 100.

In some embodiments, 50, 100, or more chips comprising the plurality of IC chips 100 may be distributed over a printed circuit board (PCB) that is 0.5 meter (m), 1 m, greater than 1 m in size, or the like. The timing signals generated by the chips 100 (e.g., the first level reference time signals, second level reference time signals, or modified second level reference time signals) permit time synchronization of operations in the chips 100 to be performed within less than a few tenth of a picosecond (ps), less than a few hundred ps, or the like of each other. The timing signals generated by the chips 100 (e.g., the first level reference time signals, second level reference time signals, or modified second level reference time signals) permit time synchronization of operations in the chips 100 to be performed at a higher accuracy of each other than with use of the chips' input reference clock signal (e.g., reference clock signal (sinus_refclk) from reference clock 110).

Time delay filter 512 in chip 500 and time delay filters in transmit sections of other chips in the daisy chain arrangement may, for example, be actuated or caused to perform encoding time delay to the received data beams at 10,000 count value of the respective reference time signals. The plurality of phase shifters 514 in chip 500 and phase shifters in transmit sections of other chips in the daisy chain arrangement may, for example, by actuated or caused to perform encoding of phases to the received data beams at 14,700 count value of the respective reference time signals. The time synchronization scheme disclosed herein allows dynamic control of the plurality of chips 100, especially control of time sensitive operations or actions in the chips 100 by linking/triggering particular operations/actions across the chips 100 to particular reference time signals. Each chip of the chips 100 generates and maintains a same reference time signal.

In this manner, RF signals to be transmitted will be provided at the same time to the plurality of antenna elements 508 for simultaneous transmission. RF signals to be transmitted will also be provided to respective subsets of plurality of antenna elements for the remaining chips so that all the antenna elements of the antenna lattice transmit or radiate at the same time.

In some embodiments, the chips of the plurality of IC chips 100 may be the same or different from each other. For example, without limitation, chip 1 may be a processor chip, chip 2 may be a DBF chip, chip 3 may be an amplifier chip, chip 4 may be memory chip, and the like. Each of these chips can include section 105 and one of sections 208, 300, or 400 so as to synchronize or simultaneously perform particular operations/actions at particular times.

Figure 7:
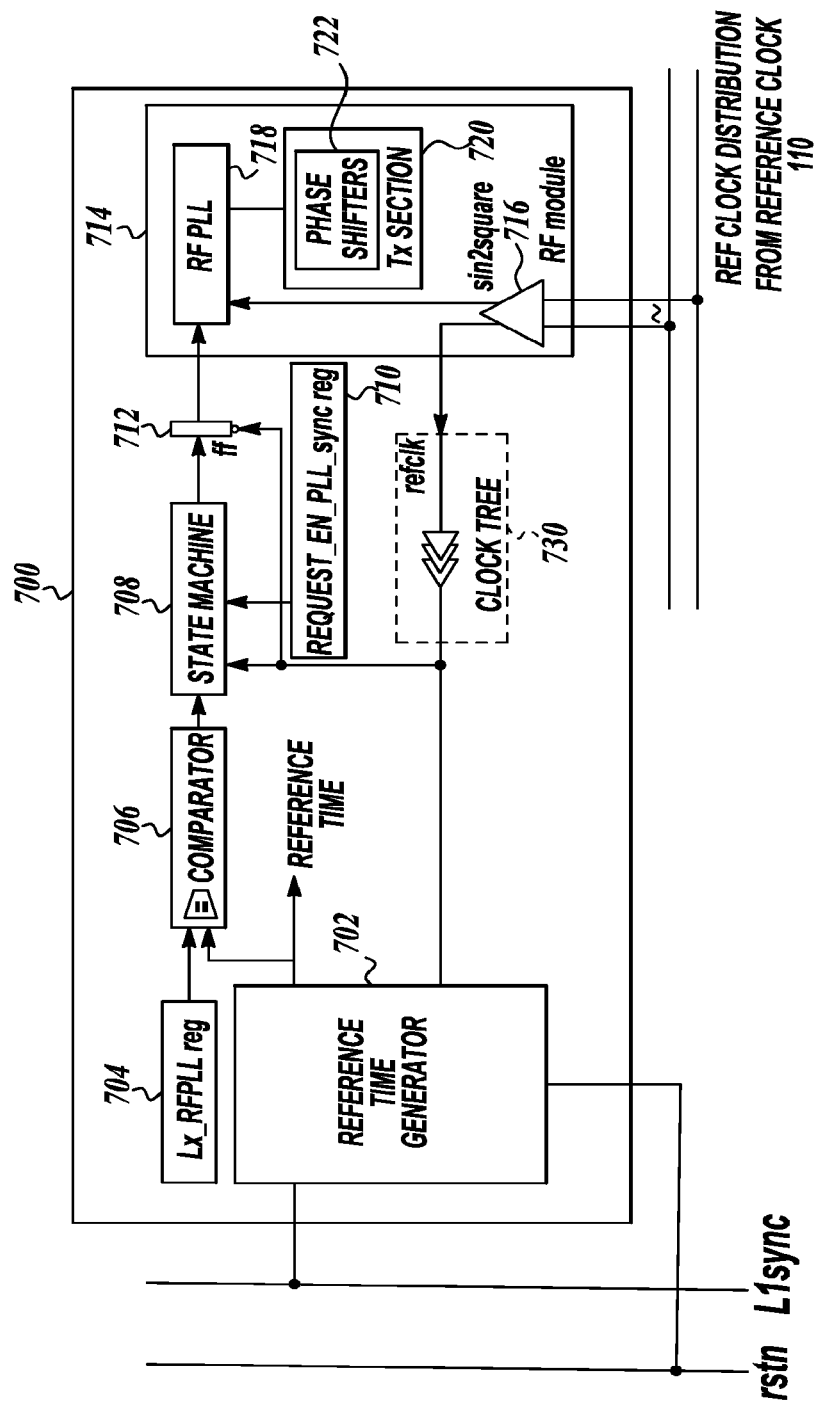
FIG. 7 is an example illustration of a block diagram showing a circuitry or component section associated with a RF PLL synchronization scheme in accordance with some embodiments of the present disclosure.

FIG. 7 is an example illustration of a block diagram showing circuitry or component section 700 associated with a RF PLL synchronization scheme in accordance with some embodiments of the present disclosure. In some embodiments, each of the IC chips 100 can include circuitry/components such as circuitry 105 associated with distribution of the timing signal L1sync in the daisy chain arrangement and section 700 configured to provide RF PLL synchronization between the IC chips 100 as described in detail herein.

In some embodiments, section 700 includes a reference time generator 702, a RF PLL register 704, a comparator 706, a state machine 708, a synchronization trigger register 710, flip flops 712, a RF module 714, and a clock tree 730. The reference time generator 702 is configured to output a reference time signal, which is an input to the comparator 706. The output of the RF PLL register 704 also comprises an input to the comparator 706. The output of the comparator 706 comprises the input to the state machine 708. The output of the synchronization trigger register 710 is also an input to the state machine 708. The flip flops 712 are electrically coupled between the state machine 708 and the RF module 714. The clock tree 730 is electrically coupled between the reference time generator 702 and RF module 714.

In some embodiments, reference time generator 702 comprises one of sections 208, 300, or 400, and correspondingly, the reference time signal outputted by reference time generator 702 comprises respective one of the first level, second level, or modified second level reference time signal. Alternatively, reference time generator 702 can comprise any of a variety of reference time generators capable of generating a reference time signal of sufficient count resolution to be able to facilitate performance of the RF PLL synchronization disclosed herein.

The RF PLL register 704 is configured to store, specify, or define a particular reference time signal count value (e.g., a pre-defined count value) associated with resetting a sigma delta modulator (SDM) included in a RF PLL 718 of the RF module 714. RF PLL register 704 is also referred to as an Lx_RF_PLL register. If the reference time signal comprises the first level reference time signal (L1_reference_time), then the particular reference time signal count value stored in the RF PLL register 704 comprises a particular first level reference time signal count value (L1_RF_PLL). If the reference time signal comprises the second level reference time signal (L2_reference_time), then the particular reference time signal count value stored in the RF PLL register 704 comprises a particular second level reference time signal count value (L2_RF_PLL). Likewise, if the reference time signal comprises the modified second level reference time signal (modified L2_reference_time), then the particular reference time signal count value stored in the RF PLL register 704 comprises a particular modified second level reference time signal count value (modified L2_RF_PLL).

In some embodiments, RF PLL 718 included in RF module 714 as well as the RF PLLs included in each of the remaining IC chips 100 are started and once they have reached a locked state (e.g., have reached a steady operational state), a synchronization between the RF PLLs in the plurality of IC chips 100 can occur. The synchronization request is initiated via an update to a slave interface or synchronization trigger signal. The readiness of the RF PLLs of the IC chips 100 to be synchronized can be indicated by a particular value of the synchronization trigger register 710. As an example, the register value of register 710 can transition from a "0" to a "1" in accordance with the synchronization request.

Comparator 706 is configured to determine if the reference time signal equals the pre-defined count value stored in the RF PLL register 704. The output of the comparison is provided to the state machine 708. The state machine 708 is configured to receive the value of the synchronization trigger register 710, also referred to as a control register. If the reference time signal equals the pre-defined count value of the RF PLL register 704 and the value of the synchronization trigger register 710 is indicative of a synchronization request or readiness, then the state machine 708 is configured to generate and provide a particular signal to the RF PLL 718 via the flip flops 712. The particular signal provided to the RF PLL 718 can be any signal that is recognized by the RF PLL 718 as the command to perform synchronization. In some embodiments, without limitation, the particular signal comprises a four refclk clock cycle pulse (e.g., a signal high comprising a pulse width of four periods of the reference clock signal generated by the reference clock 110). Such particular signal is also referred to as an LxSYNC signal, an Lx time synchronization signal, an Lx time digital synchronization reset, a sync input signal, and/or the like. If both conditions are not met, the state machine 708 is configured to provide no signal or a signal that is not the particular signal to RF PLL 718.

A state machine included in each of the remaining IC chips 100 is similarly configured to provide a particular signal to the respective RF PLL included in each of the remaining IC chips 100. All the RF PLLs in the IC chips 100 can be simultaneously synchronized using particular signals in the IC chips 100 that are generated at the same time in accordance with the same reference time signal. In some embodiments, flip flops 712 comprise one or more flip flops configured to reduce latency of providing the particular signal to RF PLL 718, to facilitate generation of the particular signal, and/or to facilitate providing the particular signal to RF PLL 718 in synchronicity with the RF PLLs in the remaining IC chips 100.

RF module 714 includes a signal processing unit 716, the RF PLL 718, and a transmit section 720. The signal processing unit 716 is configured to receive the reference clock signal (sinus_refclk) from the reference clock 110 and to process the signal into a format usable by other circuits/components of section 700. Among other things, signal processing unit 716 can convert the reference clock signal (sinus_refclk), which comprises a sinusoidal waveform shape, into the converted reference clock signal (refclk) having a square waveform shape. The converted reference clock signal (refclk) can be provided, without limitation, to each of the clock tree 730 and RF PLL 718.

RF PLL 718 is electrically coupled to the transmit section 720. Transmit section 720 includes baseband processing and RF processing subsections associated with encoding one or more data signals for RF transmission. Transmit section 720 includes, among other things, a plurality of phase shifters 722 to facilitate signal encoding and/or beamforming. Transmit section 720 can be similar to transmit section 504. The particular signal to the RF PLL 718 from the state machine 708 is used to synchronize the phases of the RF PLL 718. Similar reference time signal synchronizes phase shifters 722 with the phases of the phase shifters in the other IC chips 100. Accordingly, even though a distributed PLL scheme is implemented in the plurality of IC chips 100, precise phase synchronization between the phase shifters in the plurality of IC chips 100 is possible.

The converted reference clock signal (refclk) is provided to each of the state machine 708 and reference time generator 702 via the clock tree 730. Clock tree 730 is configured to reduce latency in the provision of the converted reference clock signal (refclk) to its intended recipients.

Figure 8:
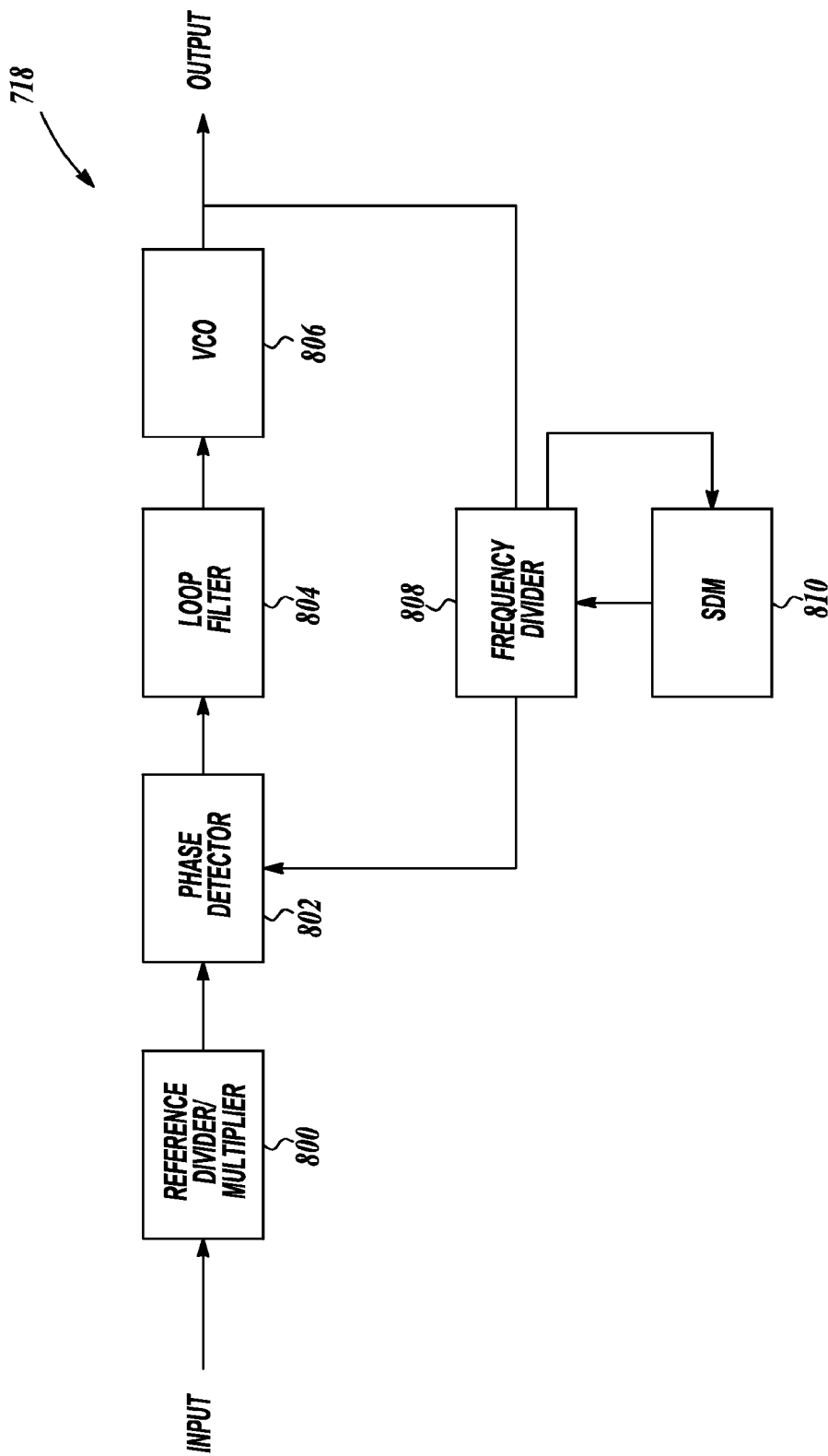
FIG. 8 is an example illustration of a block diagram showing circuitry or components included in the RF PLL of FIG. 7 in accordance with some embodiments of the present disclosure.

FIG. 8 is an example illustration of a block diagram showing circuitry or electrical components included in the RF PLL 718 in accordance with some embodiments of the present disclosure. In some embodiments, RF PLL 718 includes a reference divider/multiplier 800, a phase detector 802, a loop filter 804, a voltage controlled oscillator (VCO) 806, a frequency divider 808, and a sigma delta modulator (SDM) 810. The input to the RF PLL 718 is received by the reference divider/multiplier 800. The phase detector 802 is electrically coupled between the reference divider/multiplier 800 and the loop filter 804. The loop filter 804 is electrically coupled between the phase detector 802 and VCO 806. The output of VCO 806 comprises the output of the RF PLL 718 and also comprises an input to the phase detector 802 via the frequency divider 808. A first feedback loop is thereby formed comprising the phase detector 802, loop filter 804, VCO 806, and frequency divider 808. The output of frequency divider 808 comprises the input to SDM 810. The output of SDM 810 comprises the input to frequency divider 808. Frequency divider 808 also generates the clock for the SDM 810.

RF PLL 718 is configured to be an integer-N PLL and/or a fractional-N PLL. Depending on the parameters associated with frequency divider 808 and SDM 810, the frequency of the output signal of RF PLL 718 comprises an integer multiple or a non-integer multiple of the frequency of the input signal. Reference divider/multiplier 800 is configured to apply a certain divider or multiplier value to the input signal so as to obtain a reference signal. The phase detector 802 is configured to detect differences in the phase associated with the reference signal (the first signal) and the phase associated with the output of VCO 806 with the frequency divider ratio applied in accordance with frequency divider 808 (the second signal), and generates a (voltage) signal in accordance with the phase difference between the two signals. The phase detector 802 is also referred to as a phase comparator.

Loop filter 804 is configured to filter the output from the phase detector 802 to facilitate maintaining RF PLL stability. VCO 806 is configured to oscillate at a higher frequency than the reference signal. VCO 806 is tunable over an operational frequency band associated with the loop. The output of the loop filter 804 (e.g., the filtered error signal indicative of the phase difference) is applied to VCO 806 as the tuning voltage of VCO 806. The frequency associated with the output signal of VCO 806 is tuned or defined in accordance with the output of the loop filter 804.

Frequency divider 808 is configured to change the frequency of the signal from VCO 806 using a divider ratio selected via the SDM 810. The divider ratio N, also referred to as the divider or ratio, is applied as 1/N or ÷N to the signal from VCO 806 to generate a signal having a frequency that is the frequency of the signal from VCO 806 divided by N. Such frequency divided signal comprises the second signal received by phase detector 802.

If the output of VCO 806 comprises N times the frequency of the input signal, then the frequency divider 808 has a ratio of 1/N, near 1/N, or other ratio at that point in time. The divider ratio of the frequency divider 808 can change over time in accordance with the SDM 810. The divider ratio of frequency divider 808 can vary over time just so long as the average frequency of the output signal over time is the desired frequency of the output signal.

Initially, the RF PLL 718 will be out of lock as the first and second signals will not be the same. When the two signals become equal in phase and frequency over time, the error signal (the output of phase detector 802) will be constant and the RF PLL 718 is considered to be in a locked state. When all the RF PLLs in the plurality of IC chips 100 are in a locked state, register 710 in each of the IC chips 100 transitions to a value indicative of the readiness of the RF PLLs for synchronization.

Figure 9:
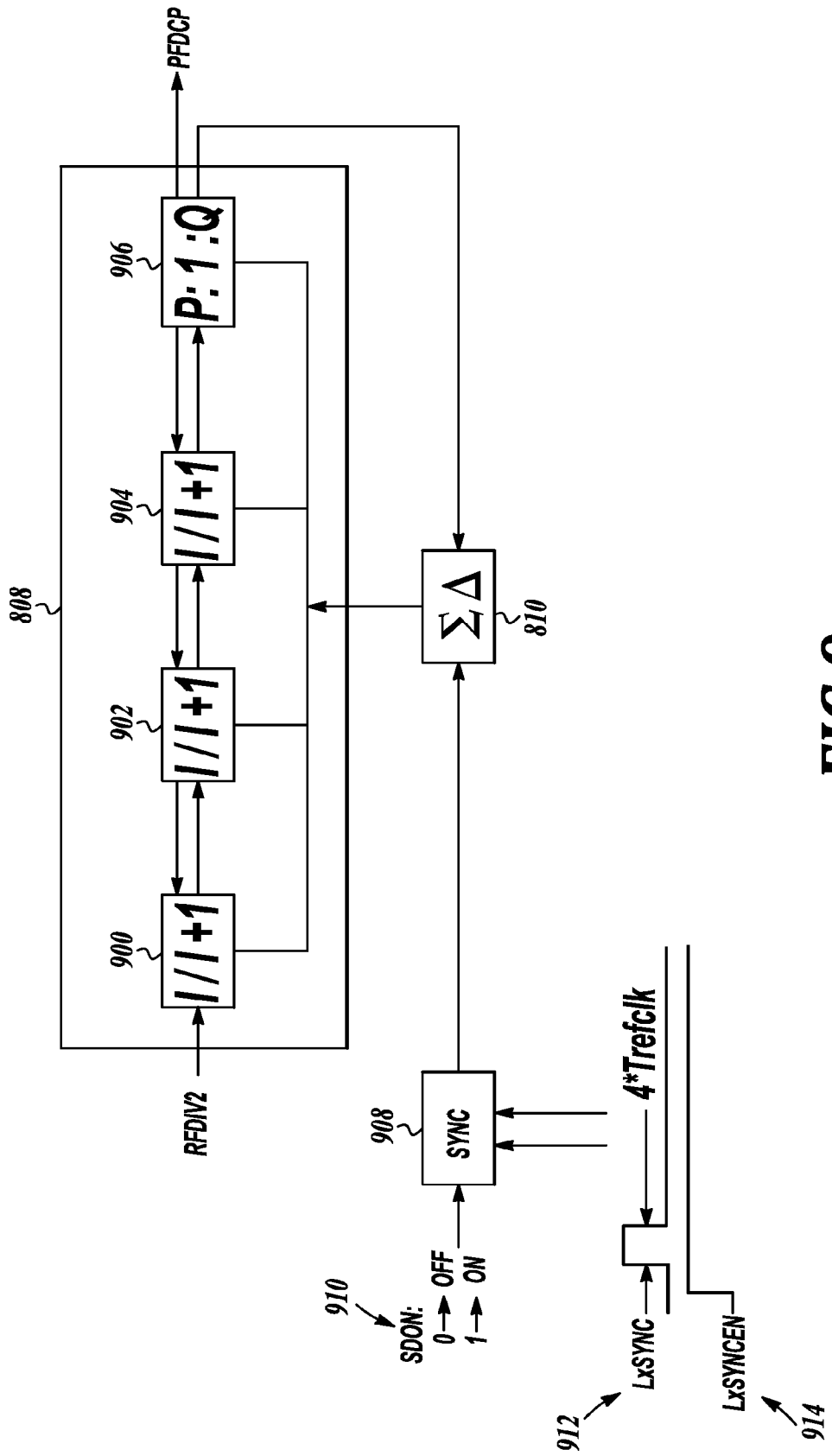
FIG. 9 is an example illustration of a block diagram showing additional circuitry or component details of the RF PLL of FIG. 8 in accordance with some embodiments of the present disclosure.

FIG. 9 is an example illustration of a block diagram showing additional circuitry or component details of the RF PLL 718 in accordance with some embodiments of the present disclosure. In some embodiments, frequency divider 808 includes a plurality of modulators such as modulators 900, 902, 904, and 906. Each of modulators 900-906 is configured to select a particular divider value under control by the SDM 810. Modulator 902 is electrically coupled between modulators 900 and 904. Modulator 904 is electrically coupled between modulators 902 and 906. SDM 810 is electrically coupled to each of modulators 900-906. Modulators 900-906 is also referred to as selective divider modulator, divider modulators, and/or the like.

Each of modulators 900, 902, and 904 comprises divider I or I+1 (denoted as 1/I+1), where I is an integer. Modulator 906 comprises an integer divider between P to Q (denoted as P:1:Q), where P and Q are integers, P<Q, and I or I+1 can equal P. This combination is an example and other combinations of integer dividers can be also used. SDM 810 comprises a sigma-delta random number generator or sequence configured to specify the configuration of modulators 900-906 so as to define the divider ratio of the feedback divider 808 to apply in the first feedback loop. The sigma-delta sequence maps to selection of particular divider values in modulators 900-906. The modulator sequence of modulators 900-906 comprises the divider ratio of the feedback divider 808. The divider ratio can range between I*I*I*P to (I+1)*(I+1)*(I+1)*Q. The modulator sequence of the feedback divider 808 changes as the sigma-delta sequence of the SDM 810 changes.

For instance, divider I is selected in modulator 900, divider I is selected in modulator 902, divider I+1 is selected in modulator 904, and divider P+2 is selected in modulator 906 in accordance with the SDM 810. The modulator sequence thus defined is a divider ratio value equal to I*I*(I+1)*(P+2).

The modulator sequence of the feedback divider 808 changes as the sigma-delta sequence of the SDM 810 changes over time. The divider ratio at a given moment in time need not equal the desired divider ratio as long as the average divider ratio over a given time equals the desired divider ratio. The divider ratio at any given moment in time can be an integer value while the average divider ratio is a non-integer value. As an example, assume the desired divider ratio is 10.1 (a fractional mode value). In 1000 cycles of the first feedback loop, 90% of the divider ratio of feedback divider 808 is 10 and in the remaining 10% of the 1000 cycles, the divider ratio is 11. The average divider ratio over the 1000 cycles is 10.1=0.9*10+0.1*11.

In some embodiments, a synchronization unit 908 electrically coupled to SDM 810 is configured to receive signals associated with operation of SDM 810. Alternatively, synchronization unit 908 can be included in SDM 810. Examples of signals received by synchronization unit 908 include, without limitation, a SDON signal 910 to control the on and off states of SDM 810, the LxSYNC signal 912 to initiate synchronization of SDM 810, and a LxSYNCEN signal 914 to effect synchronization of SDM 810 when in fractional mode. The SDON signal 910 can be set to "0" or "1" to have SDM 810 in the off or on state, respectively. The LxSYNC signal 912 comprises the particular signal generated by the state machine 708 if both conditions are met. As shown in FIG. 9, LxSYNC signal 912 comprises a pulse that is four refclk clock cycles or period wide. The LxSYNCEN signal 914 comprises an enable bit control signal that transitions from a low to a high prior to the LxSYNC signal 912. In some embodiments, both the LxSYNC signal 912 and LxSYNCEN signal 914 are enabled for SDM 810 synchronization to occur in fractional mode. The LxSYNC signal 912 alone is sufficient to initiate synchronization of SDM 810 in integer mode. Alternatively, the LxSYNC signal 912 is sufficient to initiate synchronization for fractional and integer modes of RF PLL 718.

Accordingly, the SDM of the RF PLL included in each chip of the IC chips 100 is synchronized to each other using the reference time signal. The reference time signal generated in each of the IC chips 100 is highly synchronized between the IC chips 100 as described above. Thus, the synchronization of the SDMs occurs simultaneous or nearly simultaneously of each other. The synchronization causes all the SDMs of the RF PLLs in the IC chips 100 to reset to the same point or value of the same sigma-delta sequence at the same (or near same) time so that, in turn, the same modulator sequence occurs in all the feedback dividers of the RF PLLs from that time onward. The same modulator sequence in all IC chips 100 results in setting the outputs of the RF PLLs across the IC chips 100 to the same frequency multiplier. In this manner, the RF PLLs, although distributed across the plurality of IC chips 100, perform in synchronicity with each other, enabling alignment of other chip functions such as the phases of the phase shifters between IC chips 100.

Figure 10:
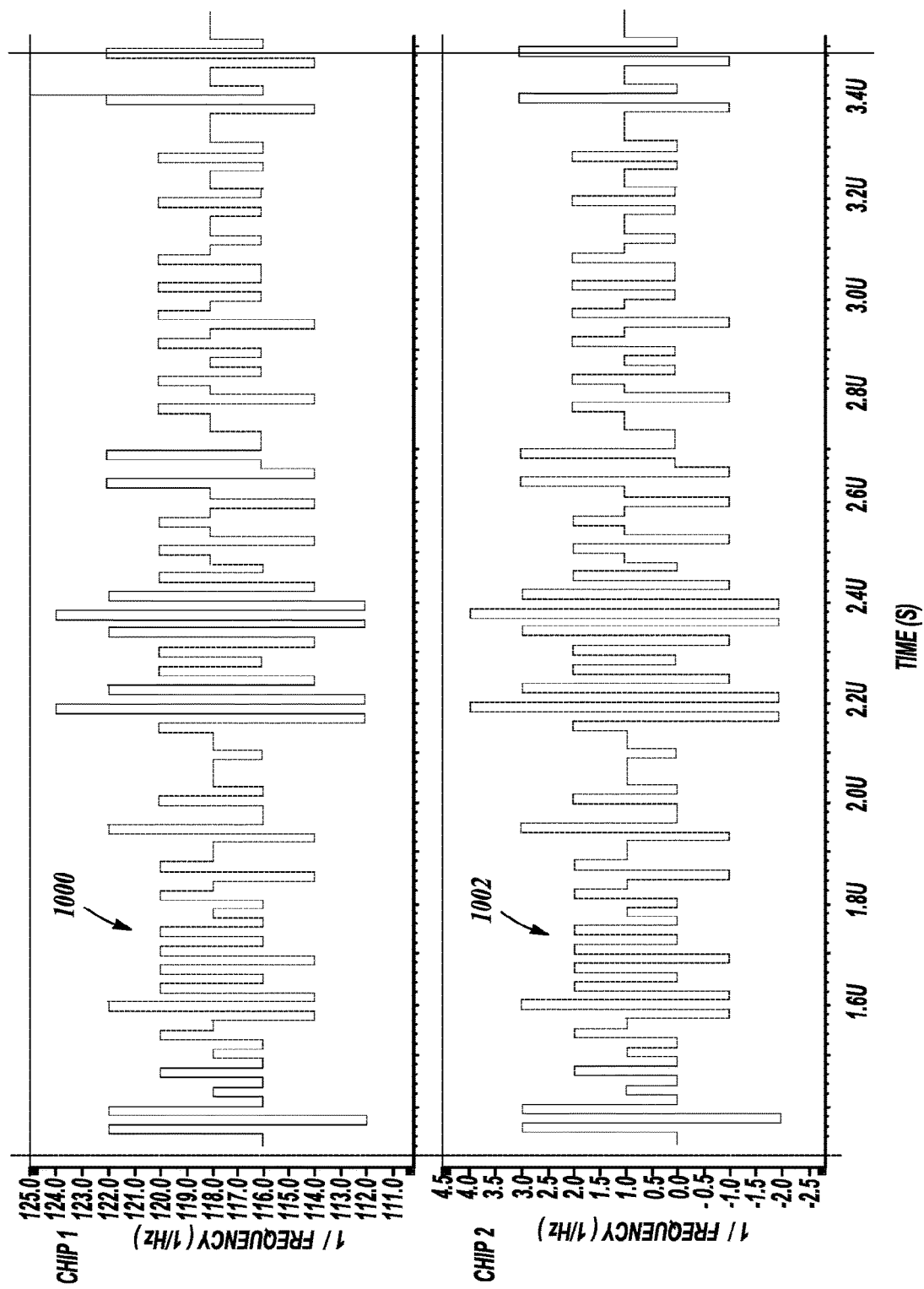
FIG. 10 is an example illustration of divider ratios over time in a plurality of IC chips in accordance with some embodiments of the present disclosure.

FIG. 10 is an example illustration of divider ratios over time in a plurality of IC chips 100 in accordance with some embodiments of the present disclosure. Plot 1000 shows the sequence of divider ratios associated with a first chip after implementation of the LxSYNC signal, and plot 1002 shows the sequence of divider ratios associated with a second chip different from the first chip after implementation of the LxSYNC signal. Notice the synchrony or sameness of the divider ratios between the first and second chips as a function of time following the SDM synchronization operation. Prior to synchronization, plots 1000 and 1002 would be offset from each other along the time axis.

In this manner, the SDMs in the RF PLLs can be reset or synchronized between the IC chips 100 using the same reference time signal generated in each of the IC chips 100. The same reference time signals in the IC chips 100 is based on a same cycle of a common reference clock. In each chip of the IC chips 100, a particular reference time count value at which the SDM is to be reset or synchronized is pre-set. The pre-set particular reference time count value is the same in all the IC chips 100. In each chip of the IC chips 100, the RF PLL is started and permitted to continue running.

Once the RF PLL has achieved a locked state, a signal indicative of the locked state or readiness for synchronization is provided to a component included in the chip. In each chip of the IC chips 100, a synchronization trigger signal is generated (by the state machine) if the current reference time signal equals the pre-set particular reference time count value and there is a signal indicative of the RF PLL locked state/readiness of synchronization. The synchronization trigger signal comprises any signal recognized by the SDM as a trigger to initiate the reset or synchronization. As an example, without limitation, the synchronization trigger signal can comprise a pulse having a pulse width comprising a particular multiple of the reference clock cycle (e.g., a four refclk clock cycle pulse).

In response to the synchronization trigger, the same sigma-delta sequence included in each of the SDMs is reset or synchronized to the same point or value. Henceforth, the RF PLLs in the IC chips 100 will have the same divider ratio sequences and, by extension, the RF PLLs will also have the same frequency multiplier at its outputs. Prior to the synchronization operation, different starting points of the sigma-delta sequence may occur within the SDMs at each given point in time, causing the corresponding divider ratio sequences in the feedback dividers to be offset from each other.

In some embodiments, the plurality of IC chips 100 and the present disclosure herein can be included in a communications system, a wireless communications system, a satellite-based communications system, a terrestrial-based communications system, a non-geostationary (NGO) satellite communications system, a low Earth orbit (LEO) satellite communications system, one or more communication nodes of a communications system (e.g., satellites, user terminals associated with user devices, gateways, repeaters, base stations, etc.), and/or the like.

Examples of the devices, systems, and/or methods of various embodiments are provided below. An embodiment of the devices, systems, and/or methods can include any one or more, and any combination of, the examples described below.

Example 1 is an apparatus including a first integrated circuit (IC) chip configured to receive a timing signal and a reference clock signal; a second IC chip configured to receive the timing signal from the first IC chip and the reference clock signal; and a third IC chip configured to receive the timing signal from the second IC chip and the reference clock signal, wherein the second IC chip is electrically coupled between the first and third IC chips, wherein the first, second, and third IC chips are configured to generate respective first, second, and third reference time signals based on the timing signal and the reference clock signal, wherein the first, second, and third IC chips include a respective first, second, and third phase lock loop (PLL), and wherein the first, second, and third PLLs are synchronized to each other based on the respective first, second, and third reference time signals.

Example 2 includes the subject matter of Example 1, and further includes wherein the first, second, and third reference time signals are generated within a same first particular cycle of the reference clock signal, wherein synchronization of the first, second, and third PLLs is initiated during a same second particular cycle of the reference clock signal, and wherein the first particular cycle of the reference clock signal is a different cycle than the second particular cycle of the reference clock signal.

Example 3 includes the subject matter of any of Examples 1-2, and further includes wherein the first, second, and third PLLs include respective first, second, and third sigma delta modulators (SDMs), and wherein the first, second, and third SDMs include a same sigma-delta sequence.

Example 4 includes the subject matter of any of Examples 1-3, and further includes wherein the first, second, and third PLLs comprise radio frequency (RF) PLLs, and wherein the first, second, and third PLLs include respective first, second, and third sigma delta modulators (SDMs).

Example 5 includes the subject matter of any of Examples 1-4, and further includes wherein the first, second, and third PLLs include respective first, second, and third sigma delta modulators (SDMs) and respective first, second, and third feedback dividers, and wherein the first, second, and third SDMs control a divider ratio associated with the respective first, second, and third feedback dividers.

Example 6 includes the subject matter of any of Examples 1-5, and further includes wherein the first, second, and third PLLs include respective first, second, and third sigma delta modulators (SDMs), and wherein synchronization of the first, second, and third PLLs comprises synchronizing the first, second, and third SDMs to each other.

Example 7 includes the subject matter of any of Examples 1-6, and further includes wherein the first, second, and third PLLs include respective first, second, and third sigma delta modulators (SDMs), wherein the first, second, and third SDMs include a same sigma-delta sequence, and wherein synchronization of the first, second, and third PLLs comprises synchronizing a starting point of the sigma-delta sequence in the first, second, and third SDMs to each other.

Example 8 includes the subject matter of any of Examples 1-7, and further includes wherein the first IC chip is configured to generate a synchronization signal to trigger phase synchronization of the first PLL to the second and third PLLs if the first reference time signal equals a pre-set reference time signal count value and the first PLL is in a locked state.

Example 9 includes the subject matter of any of Examples 1-8, and further includes wherein the synchronization signal comprises a first synchronization signal, and wherein the second IC chip is configured to generate a second synchronization signal to trigger phase synchronization of the second PLL to the first and third PLLs if the second reference time signal equals the pre-set reference time signal count value and the second PLL is in a locked state.

Example 10 includes the subject matter of any of Examples 1-9, and further includes wherein the first PLL includes a feedback divider electrically coupled to a sigma delta modulator (SDM), and wherein the SDM is configured to define a divider ratio sequence of the feedback divider.

Example 11 includes the subject matter of any of Examples 1-10, and further includes wherein the SDM includes a sigma-delta sequence, and wherein the divider ratio sequence is a function of the sigma-delta sequence.

Example 12 includes the subject matter of any of Examples 1-11, and further includes wherein the feedback divider comprises a plurality of selective divider modulators, and wherein a first selective divider modulator of the plurality of selective divider modulators is different from a second selective divider modulator of the plurality of selective divider modulators.

Example 13 includes the subject matter of any of Examples 1-12, and further includes wherein each of the first, second, and third PLLs comprises one or both of an integer mode PLL or a fractional mode PLL.

Example 14 includes the subject matter of any of Examples 1-13, and further includes wherein at least two of the first, second, or third IC chips are identical to each other.

Example 15 includes the subject matter of any of Examples 1-14, and further includes wherein at least two of the first, second, or third IC chip are different from each other.

Example 16 includes the subject matter of any of Examples 1-15, and further includes wherein the first IC chip includes a clock phase lock loop (PLL) configured to generate and provide a second reference clock signal at a higher frequency than the reference clock signal, wherein the first IC chip is further configured to generate a fourth reference time signal based on the first reference time signal and the second reference clock signal, wherein the fourth reference time signal specifies a count of a number of cycles of the second reference clock signal starting from a particular cycle of the second reference clock signal, and wherein the first PLL is synchronized based on the fourth reference time signal.

Example 17 includes the subject matter of any of Examples 1-16, and further includes wherein the fourth reference time signal has a finer count resolution than the first reference time signal within a same time period.

Example 18 is an apparatus including a first integrated circuit (IC) chip including a first phase lock loop (PLL), wherein the first PLL includes a first sigma delta modulator (SDM); a second IC chip including a second PLL, wherein the second PLL includes a second SDM; a third IC chip including a third PLL, wherein the third PLL includes a third SDM and the second IC chip is electrically coupled between the first and third IC chips; and a reference clock configured to generate and provide a reference clock signal to each of the first, second, and third IC chips, wherein the first, second, and third SDMs are reset based on the reference clock signal.

Example 19 includes the subject matter of Example 18, and further includes wherein the first, second, and third SDMs are reset based on a same particular cycle of the reference clock signal and when the first, second, and third PLLs are in a locked state.

Example 20 includes the subject matter of any of Examples 18-19, and further includes wherein the first, second, and third SDMs include a same sigma-delta sequence, and wherein resetting of the first, second, and third SDMs comprises aligning the sigma-delta sequence between the first, second, and third SDMs.

Example 21 includes the subject matter of any of Examples 18-20, and further includes wherein: the first IC chip is configured to receive a timing signal and the reference clock signal, the second IC chip is configured to receive the timing signal from the first IC chip and the reference clock signal, the third IC chip is configured to receive the timing signal from the second IC chip and the reference clock signal, the first, second, and third IC chips are configured to generate first, second, and third reference time signals based on the timing signal and the reference clock signal, and wherein resetting the first, second, and third SDMs comprises resetting based on the respective first, second, and third reference time signals.

Example 22 includes the subject matter of any of Examples 18-21, and further includes wherein the first, second, and third reference time signals are generated within a same particular cycle of the reference clock signal.

Example 23 includes the subject matter of any of Examples 18-22, and further includes wherein the first IC chip is configured to generate a first reference time signal based on a timing signal and the reference clock signal, wherein the first IC chip includes a clock phase lock loop (PLL) configured to generate and provide a second reference clock signal at a higher frequency than the reference clock signal, wherein the first IC chip is further configured to generate a second reference time signal based on the first reference time signal and the second reference clock signal, wherein the second reference time signal specifies a count of a number of cycles of the second reference clock signal starting from a particular cycle of the second reference clock signal, and wherein the first SDM is reset based on the second reference time signal.

Example 24 includes the subject matter of any of Examples 18-23, and further includes wherein the second reference time signal has a finer count resolution than the first reference time signal for a same time period.

Example 25 includes the subject matter of any of Examples 18-24, and further includes wherein the reference clock signal comprises a first reference clock signal, wherein an IC chip, comprising any of the first, second, or third IC chip, includes a first counter configured to generate, based on a timing signal and the first reference clock signal, a first reference time signal indicative of a count of periods of the first reference clock signal, wherein the IC chip includes a second reference clock configured to generate a second reference clock signal having a second frequency different from a first frequency associated with the first reference clock signal, wherein the IC chip includes a clock generator configured to generate, based on the first reference clock signal, the second reference clock signal, and a phase selection, a third reference clock signal having a third frequency or phase shift different from the second reference clock signal, wherein the IC chip includes a second counter configured to generate a third reference time signal indicative of sub-periods of the third reference clock signal in accordance with the phase selection, and wherein a SDM included in the IC chip is reset using the third reference time signal.

Example 26 includes the subject matter of any of Examples 18-25, and further includes wherein the second frequency is greater than the first frequency and the third frequency is less than the second frequency.

Example 27 includes the subject matter of any of Examples 18-26, and further includes wherein the third reference time signal indicates a number of phase increments for each period of the third reference clock signal that is 360 divided by a phase increment associated with the phase selection.

Example 28 is a radio frequency (RF) phase lock loop (PLL) including an output line; a phase detector electrically coupled to the output line; a frequency divider configured to form a feedback loop between the output line and the phase detector, the feedback divider having a divider ratio; and a sigma delta modulator (SDM) electrically coupled to the frequency divider, the SDM including a sigma-delta sequence configured to define the divider ratio, wherein a particular cycle of a reference clock signal resets the sigma-delta sequence to a particular sequence point.

Example 29 includes the subject matter of Example 28, and further includes wherein the divider ratio comprises a fractional divider ratio or an integer divider ratio.

Example 30 includes the subject matter of any of Examples 28-29, and further includes wherein the RF PLL is included in a first integrated circuit (IC) chip, further comprising a second RF PLL included in a second IC chip, the second RF PLL including a second frequency divider and a second SDM, the second frequency divider including a second divider ratio, the second SDM including a second sigma-delta sequence configured to define the second divider ratio, and wherein the sigma-delta sequence and the second sigma-delta sequence are synchronized to a same sequence point based on the particular cycle of the reference clock signal.

Example 31 includes the subject matter of any of Examples 28-30, and further includes wherein the particular cycle of the reference clock signal is identified in accordance with a count of cycles of the reference clock signal, and wherein the count had a count resolution that is greater than a periodicity of the reference clock signal.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

What is claimed is:

1. An apparatus comprising:
    one or more timing components configured to generate a reference time signal based on a timing signal and a reference clock signal; and
    a phase lock loop (PLL) configured to generate a synchronized output clock signal based on the reference clock signal and the reference time signal, wherein one or more timing components are configured to generate a synchronization signal to trigger phase synchronization of the PLL if the reference time signal equals a pre-set reference time signal count value and the PLL is in a locked state.

2. The apparatus of claim 1, wherein the reference time signal is generated at a first particular cycle of the reference clock signal, wherein synchronization of the PLL is initiated during a second particular cycle of the reference clock signal, and wherein the first particular cycle of the reference clock signal is a different cycle than the second particular cycle of the reference clock signal.

3. The apparatus of claim 1, wherein the PLL comprises a sigma delta modulator (SDM).

4. The apparatus of claim 3, wherein the PLL comprises a particular sigma-delta sequence.

5. The apparatus of claim 3, wherein:
    the PLL further comprises a first feedback divider controlled by a first divider ratio associated with the SDM.

6. The apparatus of claim 4, wherein synchronization of the PLL comprises synchronizing a starting point of the particular sigma-delta sequence in the PLL.

7. The apparatus of claim 1, wherein the PLL includes a feedback divider electrically coupled to a sigma delta modulator (SDM), and wherein the SDM is configured to define a divider ratio sequence of the feedback divider.

8. The apparatus of claim 7, wherein the SDM includes a sigma-delta sequence, and wherein the divider ratio sequence is a function of the sigma-delta sequence.

9. The apparatus of claim 7, wherein the feedback divider comprises a plurality of selective divider modulators, and wherein a first selective divider modulator of the plurality of selective divider modulators is different from a second selective divider modulator of the plurality of selective divider modulators.

10. The apparatus of claim 1, wherein the PLL comprises a fractional mode PLL.

11. The apparatus of claim 1, further comprising:
    a clock PLL configured to generate and provide a second reference clock signal at a higher frequency than the reference clock signal, wherein one or more timing components are further configured to generate a third reference time signal based on the reference time signal and the second reference clock signal, wherein the third reference time signal specifies a count of a number of cycles of the second reference clock signal starting from a particular cycle of the second reference clock signal, and wherein the PLL is synchronized based on the third reference time signal.

12. The apparatus of claim 11, wherein the third reference time signal has a finer count resolution than the reference time signal within a same time period.

13. The apparatus of claim 1, wherein the timing signal, the reference time signal, and the synchronized output clock signal are periodic signals, wherein a period of the reference time signal is greater than a period of the timing signal and wherein the period of the timing signal is greater than a period of the synchronized output clock signal.

14. The apparatus of claim 1, wherein the PLL is reset based on a combination of an active state of a synchronization enable signal and an active state of the reference time signal, wherein an inactive state of the synchronization enable signal prevents the reference time signal from resetting the PLL.

15. An apparatus comprising:
    a phase lock loop (PLL), wherein the PLL includes a sigma delta modulator (SDM), and wherein the PLL is configured to generate an output clock signal based on a reference clock signal, wherein the SDM is reset based on the reference clock signal, a timing signal, and a reference time signal; and
    one or more timing components configured to generate the reference time signal based on a timing signal and the reference clock signal; and a clock PLL configured to generate and provide a second reference clock signal at a higher frequency than the reference clock signal, wherein:
        the one or more timing components are configured to generate a second reference time signal based on the reference time signal and the second reference clock signal;
        the second reference time signal specifies a count of a number of cycles of the second reference clock signal starting from a particular cycle of the second reference clock signal; and
        the SDM is reset based on the second reference time signal.

16. The apparatus of claim 15, wherein the SDM is reset based on a particular cycle of the reference clock signal when the PLL is in a locked state.

17. The apparatus of claim 15, wherein the SDM includes a sigma-delta sequence, and wherein resetting of the SDM comprises aligning the sigma-delta sequence of the SDM to a particular point in the sigma-delta sequence.

18. The apparatus of claim 17, further configured to:
receive the timing signal and the reference clock signal;
generate the reference time signal based on the timing signal and the reference clock signal; and
reset the SDM based on the reference time signal.

19. The apparatus of claim 18, wherein the reference time signal is generated within a particular cycle of the reference clock signal.

20. The apparatus of claim 15, wherein the second reference time signal has a finer count resolution than the reference time signal for a same time period.

21. An apparatus comprising:
a phase lock loop (PLL), wherein the PLL includes a sigma delta modulator (SDM), wherein the PLL is configured to generate an output clock signal based on a reference clock signal, wherein the SDM is reset based on the reference clock signal, a timing signal, and a reference time signal, and wherein the reference clock signal comprises a first reference clock signal and the PLL is configured to generate an output clock signal based on a reference clock signal;
a counter configured to generate, based on a timing signal and the first reference clock signal, a first reference time signal indicative of a count of periods of the first reference clock signal;
a second reference clock configured to generate a second reference clock signal having a second frequency different from a first frequency associated with the first reference clock signal;
a clock generator configured to generate, based on the first reference clock signal, the second reference clock signal, and a phase selection, a third reference clock signal having a third frequency, wherein at least one or more of the third frequency or a phase shift of the third reference clock signal is different from the second reference clock signal; and
a second counter configured to generate a third reference time signal indicative of sub-periods of the third reference clock signal in accordance with the phase selection, wherein the SDM is reset using the third reference time signal.

22. The apparatus of claim 21, wherein the second frequency is greater than the first frequency and the third frequency is less than the second frequency.

23. The apparatus of claim 21, wherein the third reference time signal indicates a number of phase increments for each period of the third reference clock signal that is 360 divided by a phase increment associated with the phase selection.

24. The apparatus of claim 15, further comprising one or more timing components configured to generate the reference time signal based on the timing signal and the reference clock signal, wherein the SDM is reset based on a combination of an active state of a synchronization enable signal and an active state of the reference time signal, wherein an inactive state of the synchronization enable signal prevents the reference time signal from resetting the SDM.

25. The apparatus of claim 15, wherein the timing signal, the reference time signal, and the output clock signal are periodic signals, wherein a period of the reference time signal is greater than a period of the timing signal and wherein the period of the timing signal is greater than a period of the output clock signal.

* * * * *